(12) United States Patent
Iyengar et al.

(10) Patent No.: US 10,342,165 B2
(45) Date of Patent: Jul. 2, 2019

(54) DATA CENTER COOLANT SWITCH

(71) Applicant: International Business Machines Corporation, Armonk, NY (US)

(72) Inventors: Madhusudan K. Iyengar, Woodstock, NY (US); Pritish R. Parida, Fishkill, NY (US); Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 14/867,161

(22) Filed: Sep. 28, 2015

(65) Prior Publication Data

US 2016/0021794 A1    Jan. 21, 2016

Related U.S. Application Data

(62) Division of application No. 13/184,239, filed on Jul. 15, 2011, now Pat. No. 9,151,543.

(51) Int. Cl.
| | |
|---|---|
| *F25B 25/00* | (2006.01) |
| *H05K 7/20* | (2006.01) |
| *F28D 15/00* | (2006.01) |

(52) U.S. Cl.
CPC ......... *H05K 7/20836* (2013.01); *F28D 15/00* (2013.01); *H05K 7/2079* (2013.01)

(58) Field of Classification Search
CPC ... F25B 25/005; F25B 41/00; H05K 7/20281; H05K 7/20218; H05K 7/20627; H05K 7/20636

See application file for complete search history.

(56) References Cited

U.S. PATENT DOCUMENTS 4,608,836 A * 9/1986 MacCracken ........... F24F 3/001
165/59
5,461,876 A   10/1995 Dressler
(Continued)

FOREIGN PATENT DOCUMENTS

| GB | 2511419 B | 10/2015 |
|---|---|---|
| WO | WO2009068537 | 6/2009 |
| WO | WO2009107015 | 9/2009 |

OTHER PUBLICATIONS

Blaine R. Copenheaver, USPTO as International Searching Authority, PCT Written Opinion, PCT/US12/45884, dated Oct. 4, 2012, pp. 1-17.

(Continued)

*Primary Examiner* — David J Teitelbaum
(74) *Attorney, Agent, or Firm* — Nathan M. Rau

(57) ABSTRACT

A data center cooling system has an indoor portion wherein heat is absorbed from components in the data center, and an outdoor heat exchanger portion wherein outside air is used to cool a first heat transfer fluid (e.g., water) present in at least the outdoor heat exchanger portion of the cooling system during a first mode. When an appropriate time has been reached to switch from the first mode to a second mode, the outdoor heat exchanger portion of the data cooling system is switched to a second heat transfer fluid, which is a relatively low performance heat transfer fluid (compared to the first fluid). It has a second heat transfer fluid freezing point, lower than the first heat transfer fluid freezing point, and sufficiently low to operate without freezing when the outdoor air temperature drops below a first predetermined relationship with the first heat transfer fluid freezing point.

5 Claims, 22 Drawing Sheets

(56) References Cited

U.S. PATENT DOCUMENTS

| | | |
|---|---|---|
| 6,397,618 B1 | 6/2002 | Chu et al. |
| 6,628,520 B2 | 9/2003 | Patel et al. |
| 6,691,526 B2 | 2/2004 | Gether et al. |
| 6,714,412 B1 | 3/2004 | Chu et al. |
| 2004/0007011 A1 | 1/2004 | Tanaka |
| 2005/0126747 A1 | 6/2005 | Chu et al. |
| 2007/0209782 A1 | 9/2007 | Wyatt et al. |
| 2007/0213000 A1 | 9/2007 | Day |
| 2007/0235167 A1 | 10/2007 | Brewer et al. |
| 2008/0055846 A1* | 3/2008 | Clidaras .......... G06F 1/20 361/679.41 |
| 2008/0060368 A1 | 3/2008 | Campbell |
| 2008/0165499 A1 | 7/2008 | Campbell et al. |
| 2008/0266726 A1 | 10/2008 | Murakami et al. |
| 2009/0234705 A1* | 9/2009 | Brunschwiler ..... G06F 1/206 62/259.2 |
| 2010/0101254 A1 | 4/2010 | Besore et al. |
| 2010/0246117 A1 | 9/2010 | Brunschwiler et al. |
| 2013/0014926 A1 | 1/2013 | Iyengar et al. |
| 2013/0081781 A1 | 4/2013 | Chainer et al. |

OTHER PUBLICATIONS

James Hamilton, An Architecture for Modular Data Centers, Microsoft Corporation, Third Biennial Conference on Innovative Data Systems Research (CIDR), Jan. 7-10, 2007, Asilomar, CA, USA, pp. 1-8.

Examination Report, UK Patent Application GB1401041.7, dated Apr. 28, 2015, pp. 1-3 plus cover letter.

Iyengar; Madhusudan K.; et al., Unpublished U.S. Appl. No. 14/867,199, filed Sep. 28, 2015, pp. 1-33 plus 22 sheets formal drawings.

Patents Act 1977: Patents Rules 2007, Notification of Grant: Patent Serial No. GB2511419, dated Sep. 8, 2015, 2 pages.

* cited by examiner

DATA CENTER COOLANT SWITCH

CROSS-REFERENCE TO RELATED APPLICATIONS

This patent application is a divisional of U.S. patent application Ser. No. 13/184,239 filed 15 Jul. 2011, entitled "DATA CENTER COOLANT SWITCH." The complete disclosure of the aforementioned U.S. patent application Ser. No. 13/184,239 is expressly incorporated herein by reference in its entirety for all purposes.

STATEMENT OF GOVERNMENT RIGHTS

This invention was made with Government support under Contract No.: DE-EE0002894 (Department of Energy (DOE). The Government has certain rights in this invention.

FIELD OF THE INVENTION

The present invention relates to the thermodynamic arts, and, more particularly, to thermal control of computer equipment and the like.

BACKGROUND OF THE INVENTION

Ambient air cooling (also known as air-side economizers) has been proposed to reduce data center power consumption. In any locale where outdoor ambient temperatures below freezing are anticipated, an antifreeze solution (typically glycol-based) is required within the coolant loop that is exposed to the ambient environment, so as to avoid freeze-up if the loop circulation stops for any reason. This antifreeze solution is not as effective in thermal transport as water alone, with the degree of ineffectiveness varying depending on the exact character of the devices putting heat into the coolant loop. This lower efficiency can be significant when attempting to allow for ambient air cooling at high ambient temperatures, adding cost and complexity to the systems being cooled with the coolant loop.

SUMMARY OF THE INVENTION

Principles of the invention provide techniques for a data center coolant switch. In one aspect, an exemplary method includes the step of operating a data center cooling system in a first mode. The data center cooling system has an indoor portion wherein heat is absorbed from components in the data center, and the data center cooling system has an outdoor heat exchanger portion wherein outside air is used to cool a first heat transfer fluid present in at least the outdoor heat exchanger portion of the cooling system during the first mode. The first heat transfer fluid is a relatively high performance heat transfer fluid, and the first heat transfer fluid has a first heat transfer fluid freezing point. Another step includes determining that an appropriate time has been reached to switch from the first mode to a second mode. A further step includes, responsive to the determining, switching the outdoor heat exchanger portion of the data cooling system to a second heat transfer fluid, in preparation for operation in the second mode. The second heat transfer fluid is a relatively low performance heat transfer fluid, and the second heat transfer fluid has a second heat transfer fluid freezing point lower than the first heat transfer fluid freezing point. The second heat transfer fluid freezing point is sufficiently low to operate without freezing when the outdoor air temperature drops below a first predetermined relationship with the first heat transfer fluid freezing point.

In another aspect, a data center cooling system includes an indoor portion wherein heat is absorbed from components in the data center; and an outdoor heat exchanger portion wherein outside air is used to cool a first heat transfer fluid present in at least the outdoor heat exchanger portion of the cooling system during a first mode of operation. The first heat transfer fluid is a relatively high performance heat transfer fluid, and the first heat transfer fluid has a first heat transfer fluid freezing point. Also included is a coolant switch arrangement configured to switch the outdoor heat exchanger portion of the data cooling system to a second heat transfer fluid during a second mode of operation. The second heat transfer fluid is a relatively low performance heat transfer fluid, and the second heat transfer fluid has a second heat transfer fluid freezing point lower than the first heat transfer fluid freezing point. The second heat transfer fluid freezing point is sufficiently low to operate the outdoor heat exchanger portion of the data center cooling system without freezing when the outdoor air temperature drops below a first predetermined relationship with the first heat transfer fluid freezing point.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed; or by sending signals to control a valve, fan, or the like, based on sensed temperature, pressure, flow, or the like. For the avoidance of doubt, where an actor facilitates an action by other than performing the action, the action is nevertheless performed by some entity or combination of entities.

One or more embodiments of the invention or elements thereof (for example, system control and/or system design) can be implemented in the form of, or otherwise facilitated by, a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein. Examples of use of a computer program product or computer-related means include sending signals to control a valve, fan, or the like, based on sensed temperature, pressure, flow, or the like; and/or use of a computer for computer-aided system design.

Techniques of the present invention can provide substantial beneficial technical effects. In one or more embodiments, a significant technical benefit is the ability to operate both winter and summer with lower cost, higher performance cooling in the summer provided by the water coolant and freeze resistance in the winter provided by the antifreeze solution (glycol) utilized when the lower performance of this solution is not detrimental to system temperature issues.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments provide a system that switches between a first coolant, such as water, and a second coolant, such as an antifreeze solution, in a coolant loop. In some instances, water is used during the high temperature portion of the year and an antifreeze solution is used during the low temperature portion of the year. When the temperature outside is lower, the lower thermal efficiency of the anti-freeze solution can be tolerated. Lower thermal efficiency in this context means a net higher temperature differential between the devices being cooled and the ambient air temperature and/or a higher power cost to move and remove the heat from the coolant. In the case of a glycol mix, it's higher viscosity requires more power to move the same fluid and it's lower ability to conduct and carry heat means a higher temperature drop (higher operating temperature) for the same coolant flow rate.

In one or more instances, the system is implemented by adding a series of shut-off valves (which can be computer controlled in some cases) to the coolant loop, along with a storage tank for the antifreeze solution. The valves can, in at least some instances, be located near the inlet of the coolant recirculation pump. When switching from water to anti-freeze, the return flow from the system being cooled is directed out of the loop for appropriate discard or storage using one "shut-off" valve structure. At another downstream location, a similar "shut-off" valve structure is fed with the antifreeze solution. When antifreeze solution begins to appear at the discard/storage outlet, the valves are returned to the normal circulation position and the swap is complete. The procedure is repeated, reversing the positions of the water and antifreeze, to replace the antifreeze with water for higher ambient temperature environments.

Reference will now be made to certain figures to illustrate the working and implementation of one or more embodiments of a coolant switching design and control technique for same.

Figure 1:
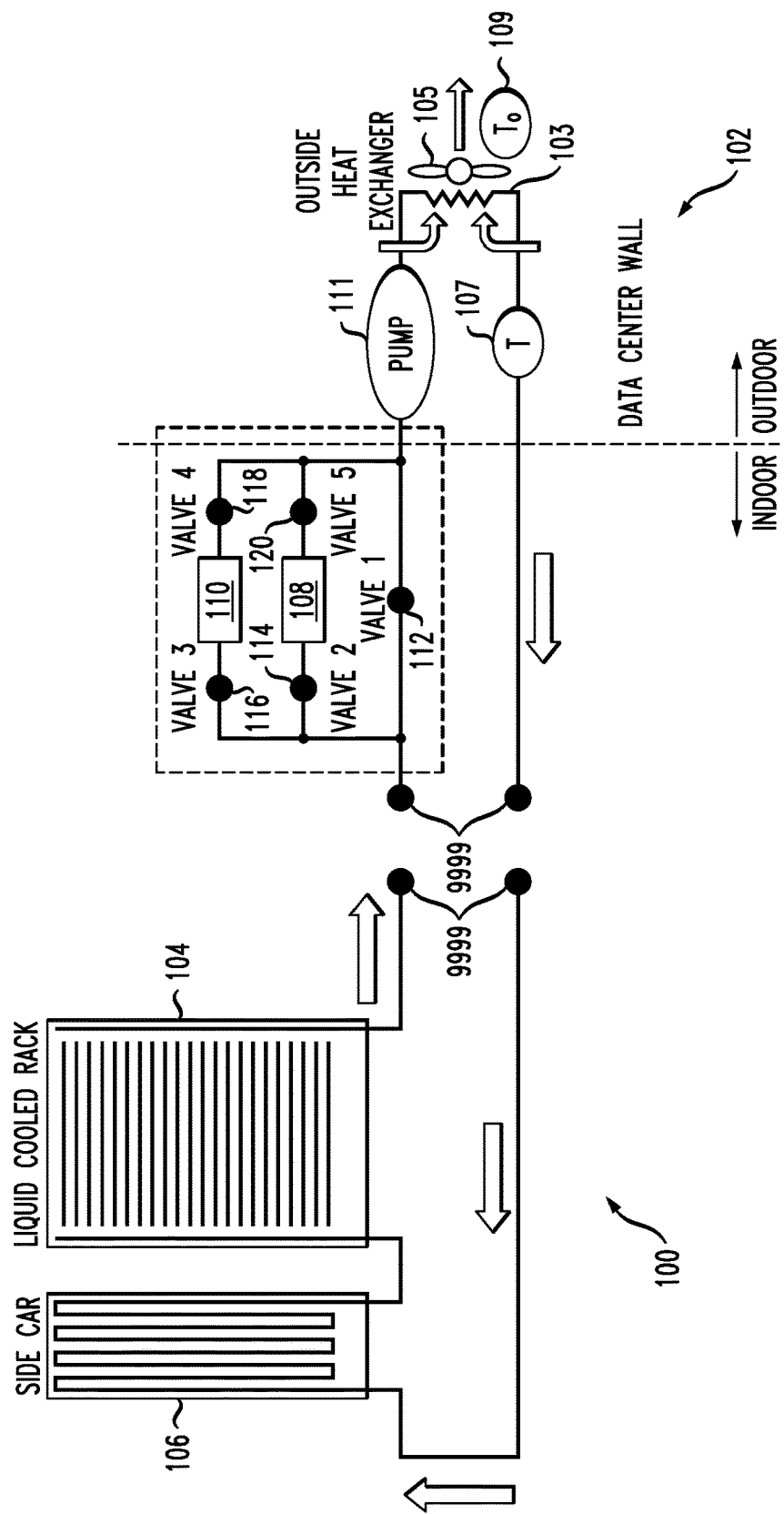
FIG. 1 shows an exemplary data center liquid cooling system, according to an aspect of the invention.

FIG. 1 shows an exemplary embodiment in the context of a liquid cooled data center 100 with an air-side economizer 102, including outside heat exchanger 103 wherein fan 105 blows outside air across the heat exchanger 103 to cool the heat transfer fluid in the cooling loop. The system being cooled includes a liquid cooled rack 104 and a side car segment 106 (the side car segment is an air-to-liquid heat exchanger, basically a radiator similar to a car's radiator) and is present inside the data center 100. The storage tanks for the high thermal performance coolant (such as water) and for the anti-freeze solution (low thermal performance, for example, Glycol) are also installed inside the data center housing and are designated as 108 (high performance) and 110 (low performance). The storage tanks are connected to the cooling loop with the help of a series of shut-off valves 112, 114, 116, 118, 120 that can be computer controlled. In the case of computer controlled shut-off valves, the outdoor air temperature (measured at temperature sensor 109) as well as the coolant temperature going to the system (measured at temperature sensor 107) will be used as an input for the shut-off valve control technique. Note the pump 111. The large arrows indicate the direction of fluid flow. The working of this particular implementation is schematically explained through FIGS. 2-6. In FIGS. 2-5, shaded dots mean that the valve is closed and a white dot means the valve is open. The dots 9999 in FIGS. 1, 7, 8, and 15 represent pipe connectors and the gap there-between is not intended to suggest a physical gap in the pipes, but rather to delineate that the portion of the given figure that is on the left of the dots represents an IT rack while the portion of the given figure on the right of the dots represent the piping scheme for the coolant switch operation of one or more embodiments.

Figure 2:
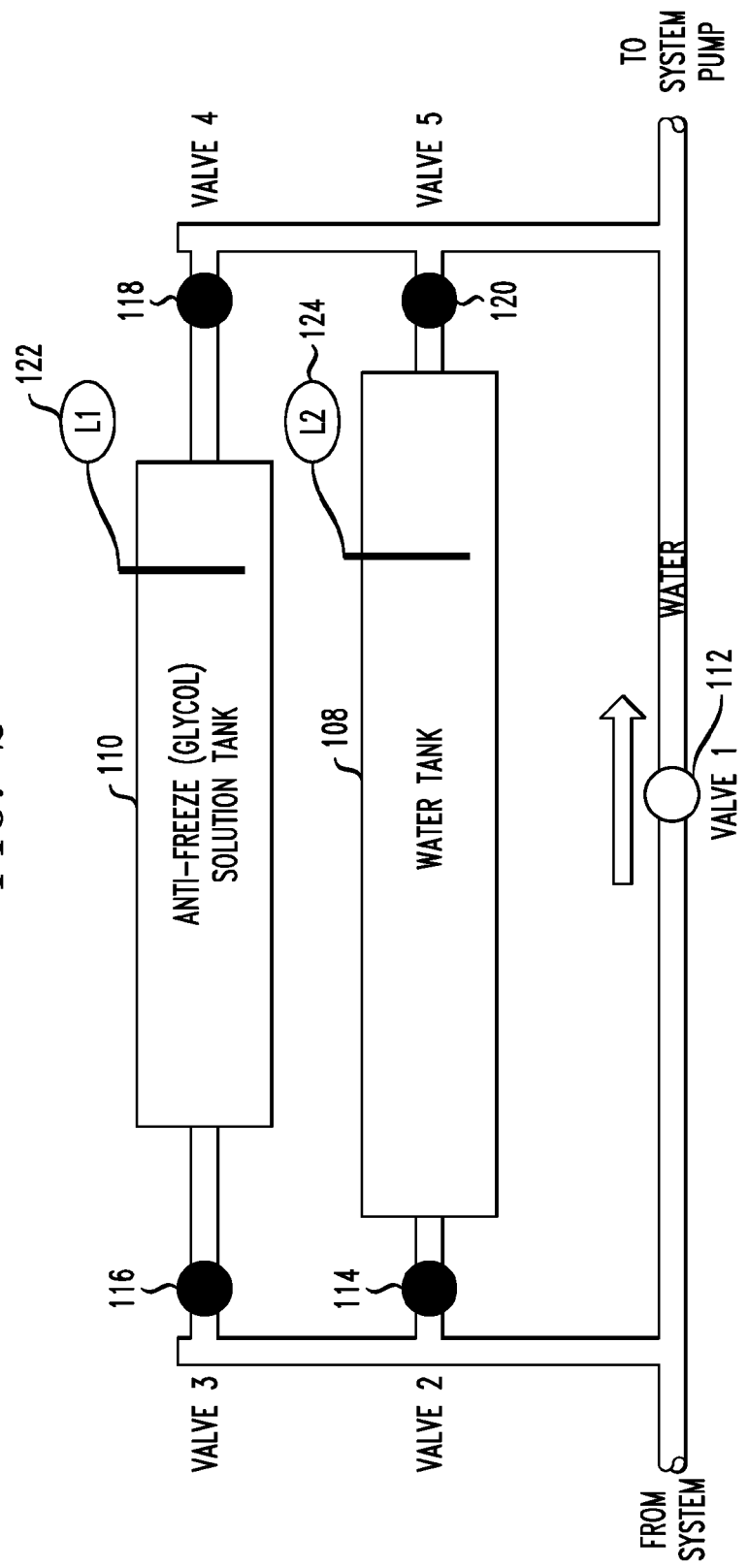
FIGS. 2-5 show four stages in operation of the system of FIG. 1.
Figure 3:
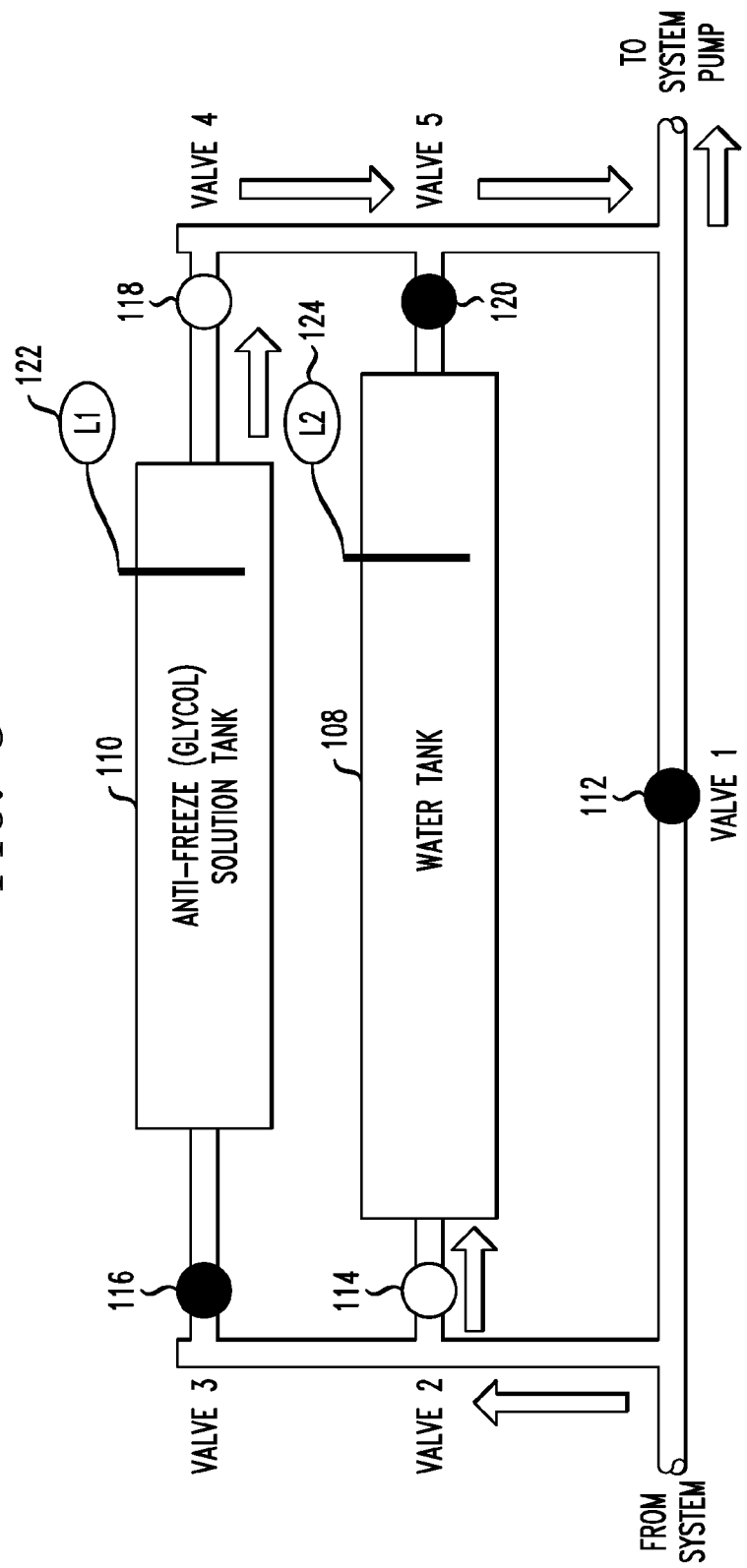
Figure 4:
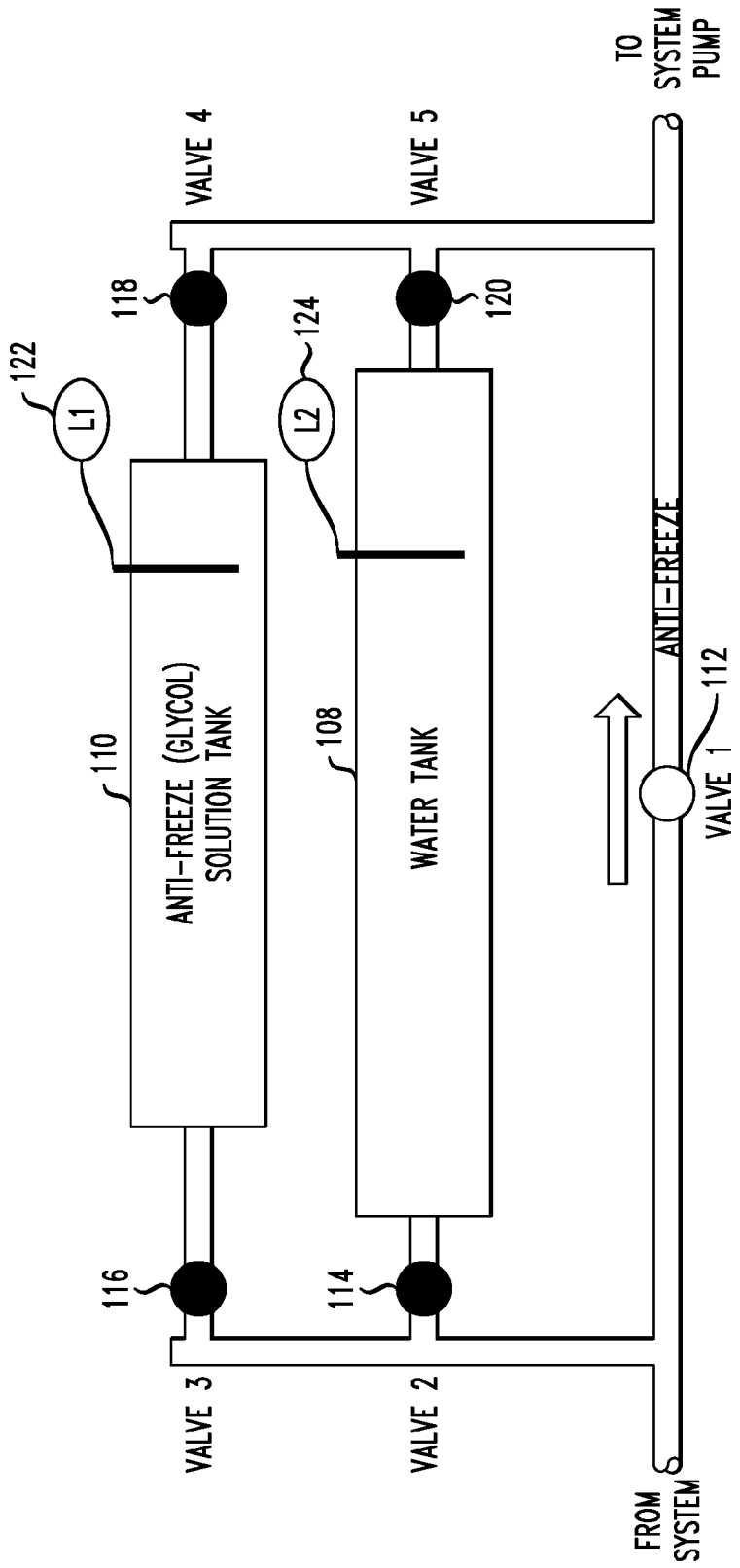
Figure 5:
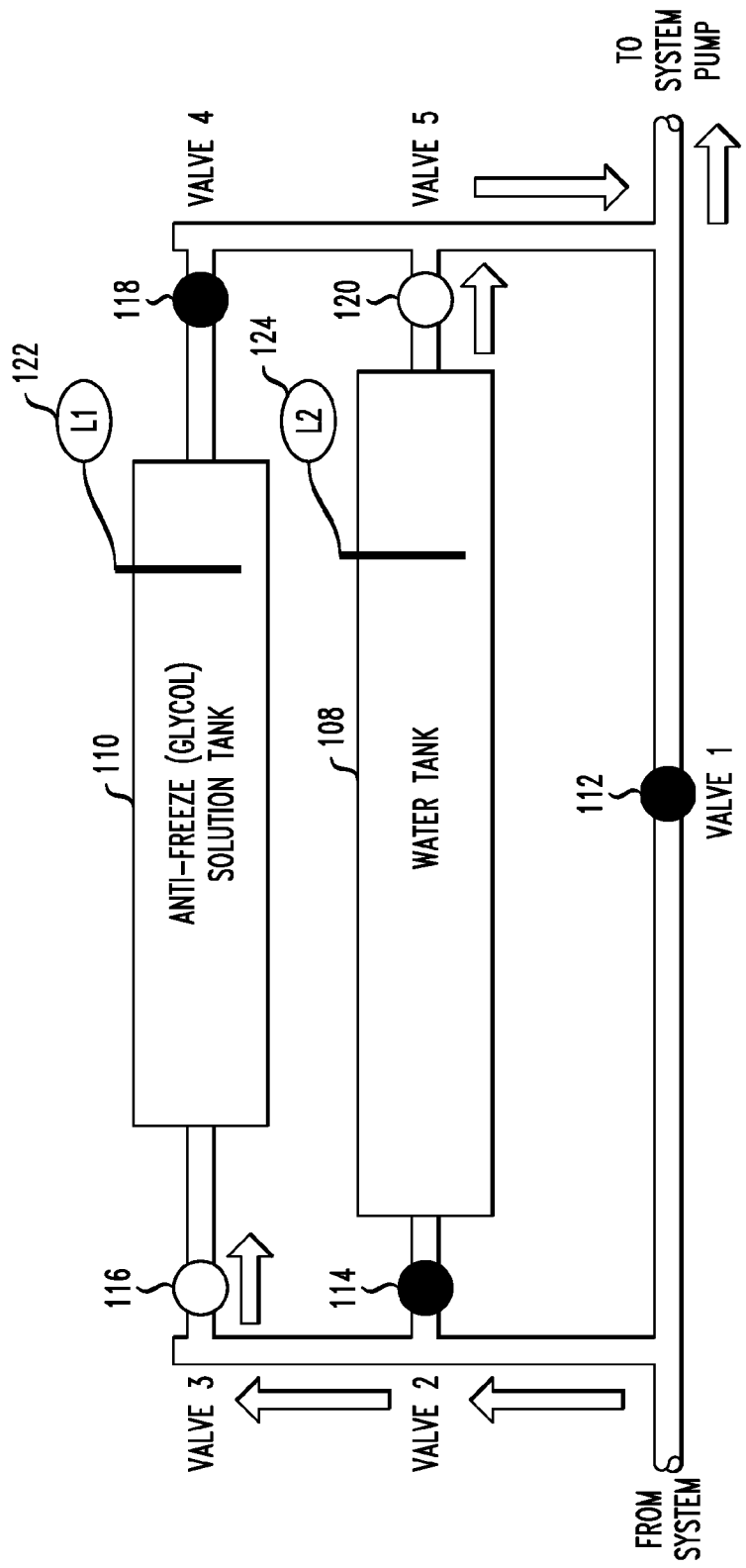

FIG. 2 represents stage 1 which is normal system operation stage with a high thermal performance coolant (such as water) in the cooling loop. In this stage, Valve 1, 112, is open and all other valves 114, 116, 118, 120 are closed. FIG. 3 represents stage 2 which is the stage of anti-freeze insertion into the cooling loop. At this stage, Valve 1, 112, is closed and Valves 2 and 4 114, 118 are open to allow the high thermal performance coolant (such as water) to drain out to storage tank 108 and to allow an anti-freeze solution (such as Glycol) to flow out from the storage tank 110 into the cooling loop. The amount of anti-freeze solution flowing into the system as well as the water flowing out of the system is monitored using fluid level sensors L1 and L2, 122, 124, respectively. The outputs from these fluid level sensors can also act as inputs for the control technique to initiate the opening and closing of certain valves. FIG. 4 represents Stage 3 which is the normal system operation stage with anti-freeze solution in the cooling loop. At this stage, the Valve 1, 112, is open and all other Valves 114, 116, 118, 120 are closed. FIG. 5 represents stage 4 which is the switch back to high thermal performance coolant (water insertion) stage. At this stage, Valve 1, 112, is closed and Valves 3 and 5, 116, 120 respectively, are open to allow the anti-freeze solution (Glycol) to drain out to storage tank 10 and to allow high thermal performance coolant (water) to flow out from storage tank 108 into the cooling loop. The amount of anti-freeze solution flowing out of the cooling loop as well as water flowing into the cooling loop system is monitored using fluid level sensors L1, L2 (122, 124).

Figure 6:
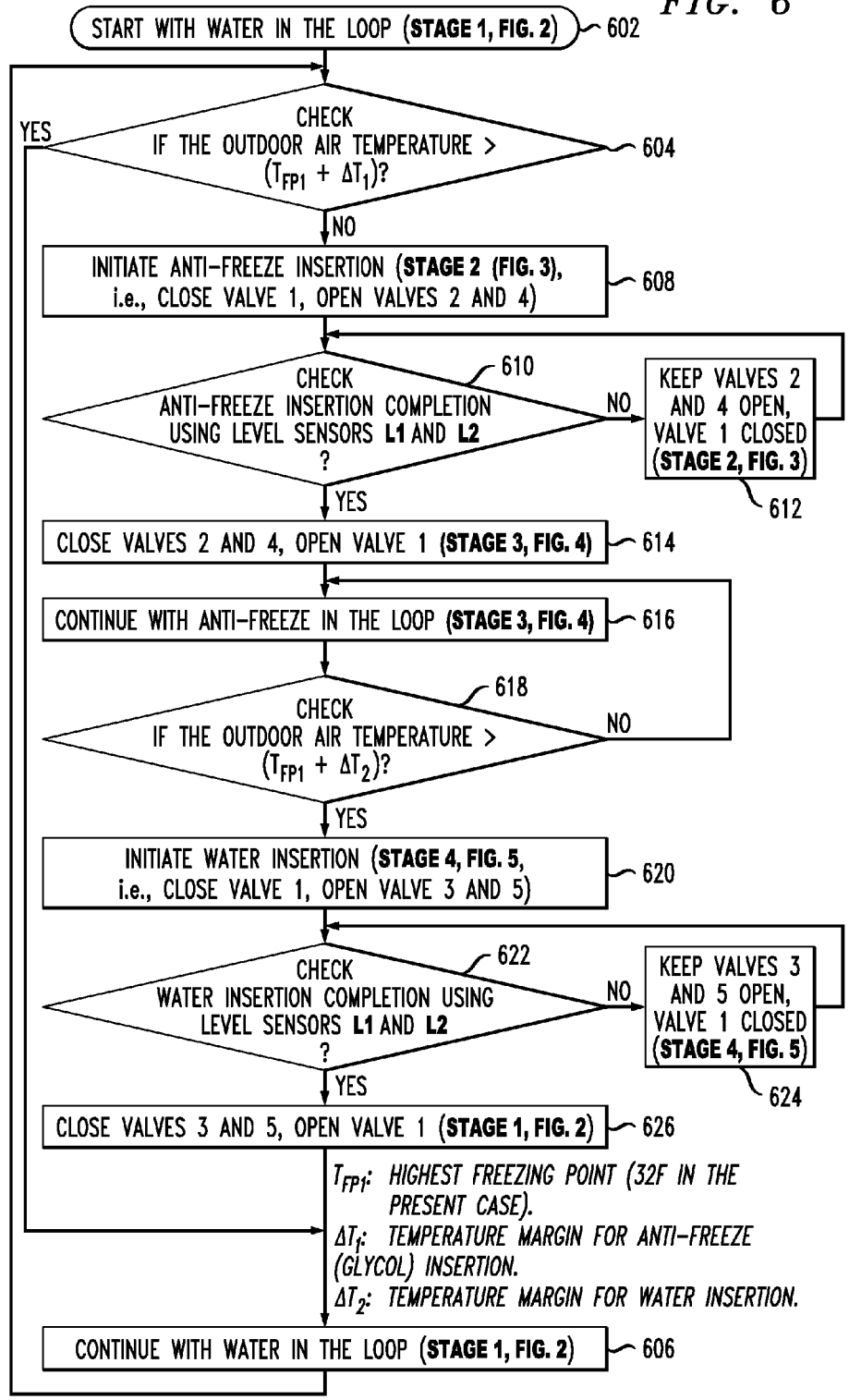
FIG. 6 shows a flow chart for operation of the system of FIG. 1.

FIG. 6 is a flowchart that explains the working of the coolant switch based on the outdoor air temperature. The cooling system can be initiated from any stage, however for simplicity; stage 1 (FIG. 2) is represented as the initial state of the cooling system, at 602. The outdoor air temperature is constantly monitored, as at 604, and based on this temperature, the exemplary coolant switch process can be activated. In particular, if the outdoor air temperature is greater than the freezing point $T_{FP1}$ of water or other high performance coolant, plus a suitable safety margin $\Delta T_1$, as per the "Y" branch of block 604, continue with water or other high performance coolant in the loop, as at 606, and continue to monitor.

However, when the outdoor air temperature drops below a certain temperature check point ($T_{FP1}+\Delta T_1$), "N" branch of block 604, the anti-freeze solution (Glycol) insertion stage (FIG. 3) is initiated by the opening of Valves 2 and 4, 114, 118 and closing of Valve 1, 112, as in step 608. The amount of anti-freeze solution (Glycol) flowing into the cooling loop and the amount of Water flowing out of the system are monitored using the fluid level sensors L1 and L2, 112, 124 respectively, as in step 610. If insertion is not completed, as per the "N" branch of block 610, keep the valves in the state just described, at step 612, and continue monitoring. Once the required amount of anti-freeze is dispersed into the cooling loop (or rather, when the anti-freeze insertion is complete), the next stage (stage 3, FIG. 4) is activated in step 614, by closing Valves 2 and 4, 114, 118, and by opening Valve 1, 112 simultaneously, as in step 614.

The cooling system operates at this stage, as indicated at 616, until the outdoor air temperature goes above a certain temperature check point (freezing point of water or other high performance coolant plus another suitable safety margin) ($T_{FP1}+\Delta T_2$). Note the checking in step 618. If the outdoor air has not gone above this temperature, as per the "N" branch of block 618, continue with anti-freeze in the loop. When the outdoor air temperature goes above this temperature check point ($T_{FP1}+\Delta T_2$), as per the "Y" branch of block 618, the water insertion stage (stage 4, FIG. 5) is activated as per step 620 by the opening of valves 3 and 5, 116, 120, and closing of Valve 1, 112. The amount of water flowing into the cooling loop and the amount of anti-freeze solution (Glycol) flowing out of the system are monitored using the fluid level sensors L2 and L1, 124, 122 respectively, as at 622. If insertion is not completed, as per the "N" branch of block 622, keep the valves in the state just described, at step 624, and continue monitoring. Once the required amount of water is dispersed into the cooling loop (or rather, when the water insertion is complete), as per the "Y" branch of block 622, the next stage (stage 1, FIG. 2) is activated, as indicated at 626, by closing Valves 3 and 5 116, 120 and by opening Valve 1, 112, simultaneously.

The cooling system operates at this stage, as indicated by the logical flow back to step 606, until the outdoor air temperature goes below a certain temperature check point ($T_{FP1}+\Delta T_1$), as described with respect to 604, 606, 608. Once started, the process repeats itself based on the outdoor air temperature. This coolant switching operation can take place two or more times a year depending upon location of the system, weather conditions of the location and other environmental factors.

Figure 7:
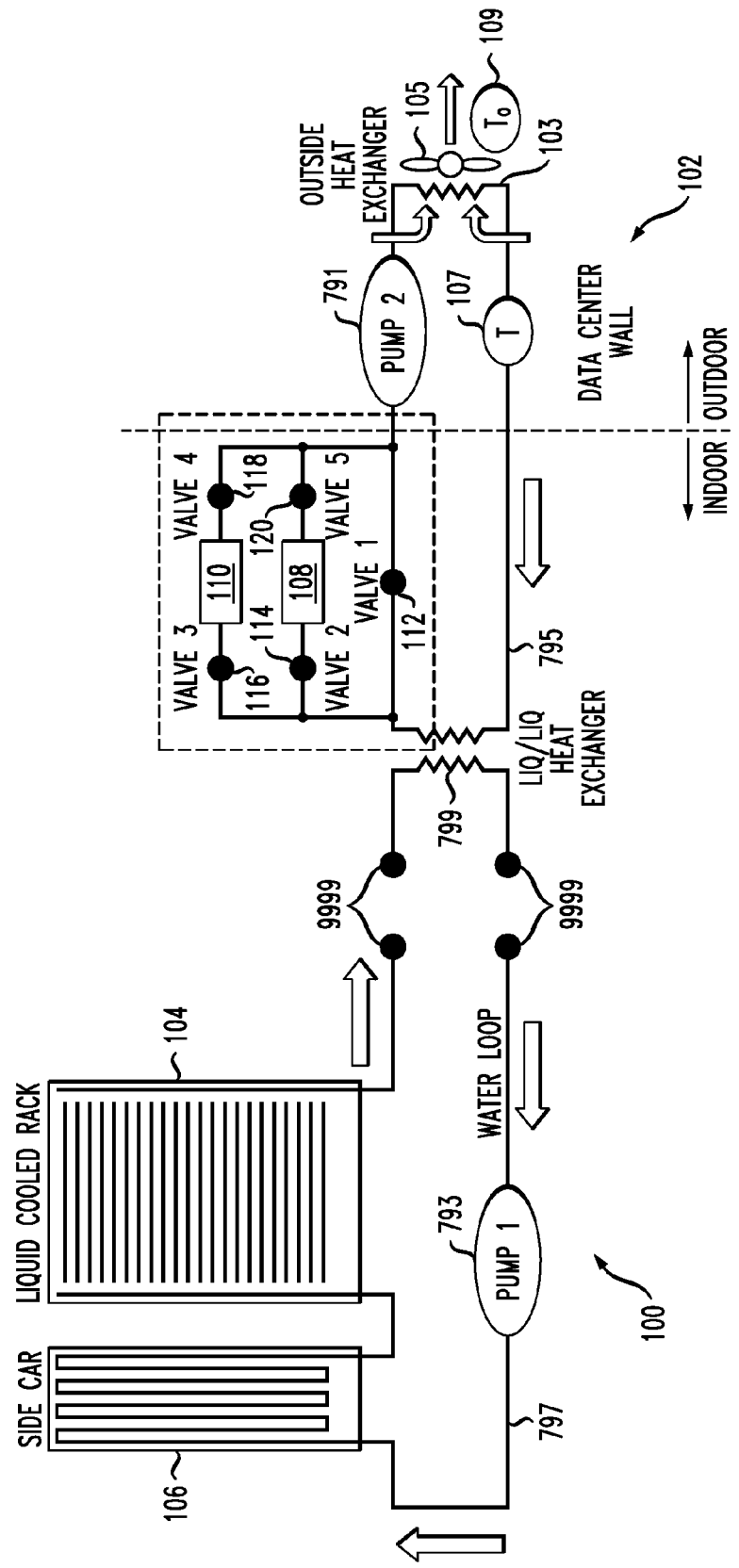
FIG. 7 shows another exemplary data center liquid cooling system, according to an aspect of the invention.

FIG. 7 is another possible way of implementing the coolant switching process in a liquid cooled data center 100 with an air-side economizer 102. Similar elements in the figures have received the same reference character. The system being cooled includes liquid cooled rack 104 and side car segment 106 and is present inside the data center 100. The indoor components of this embodiment include liquid-to-liquid heat exchanger 799 in addition to the indoor components depicted in FIG. 1. The presence of the liquid-to-liquid heat exchanger 799 helps de-couple the cooling loops into an indoor cooling loop 797 and an outdoor cooling loop 795. However, having two cooling loops necessitates the installment of an additional pump, such that the system includes pump 1, 793, for the indoor loop and pump 2 791 for the outdoor loop. As depicted in FIG. 7, the indoor cooling loop stays completely inside the data center housing while the outdoor loop stays partially indoors and partially outdoors.

Thus, the indoor cooling loop 797 can run with the high thermal performance coolant in the loop under all outside air temperature conditions. The outdoor loop 795, on the other hand, will require coolant switching based on the environmental conditions as well as based on specific application requirements. The storage tanks for the high thermal performance coolant (such as water) and for the anti-freeze solution (low thermal performance, for example, Glycol) are installed on the outdoor cooling loop, as shown at 108, 110, respectively, and are also installed inside the data center housing. The storage tanks are connected to the cooling loop with the help of a series of shut-off valves 112, 114, 116, 118, 120 that can be computer controlled. In case of computer controlled shut-off valves, the outdoor air temperature, measured at 109, as well as the coolant temperature going to the system, measured at 107, will be used as an input for the shut-off valve control technique. The working of this particular implementation is similar to that of the design presented in FIG. 1 and is schematically explained through FIGS. 2-6 described above. It is to be noted here that with this aspect, there could be slight mixing of the two coolants during the switching operation.

Figure 8:
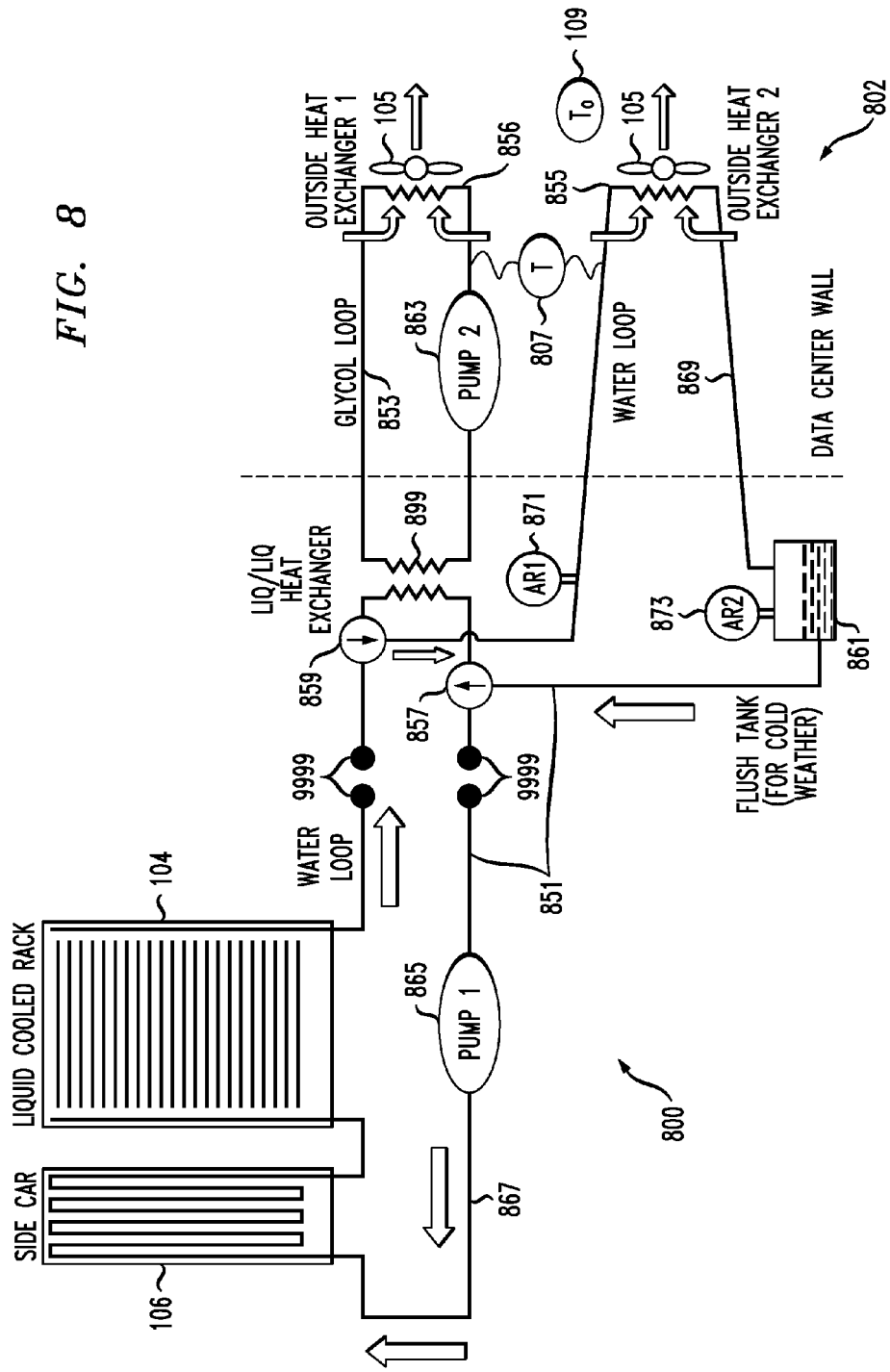
FIG. 8 shows still another exemplary data center liquid cooling system, according to an aspect of the invention.

FIG. 8 schematically represents another method of implementing coolant switching techniques in a liquid cooled data center 800 with an air-side economizer 802. The configuration of FIG. 8 may appear to be a hybrid between the configurations shown in FIG. 1 and FIG. 7. However, it uses a different process to switch between the coolants. Moreover, in this process, there is no mixing or other physical interaction between the two coolants as the two coolants run inside different cooling loops. In particular, this embodiment employs a partial water (high thermal performing coolant) cooling loop 851 with an outside heat exchanger (outside heat exchanger 2, 855) and two three-way valves 857, 859 (arrows indicate flow direction) in addition to the indoor- and outdoor-cooling loops. The two three-way valves help toggle the flow in the water loop 851. The system being cooled includes liquid cooled rack 104 and side car segment 106 and is present inside the data center 800. In addition, the indoor components of this design include liquid-to-liquid heat exchanger 899, a water (high thermal performance coolant) flush tank 861 and the two three-way valves 857, 859. Note also the outdoor heat exchanger 856 of the glycol loop.

The presence of liquid-to-liquid heat exchanger 899 helps de-couple the cooling loops into a high thermal performance coolant (water) loop 851 and outdoor anti-freeze solution (Glycol) loop 853. However, having two cooling loops necessitates the installment of an additional pump 863 in the outdoor anti-freeze solution (Glycol) loop; note also pump 865 in the indoor water loop. As depicted in FIG. 8, the water loop has two parts; one part 867 that stays completely inside the data center housing and the other part 869 that leads to the outside. Since the loop 869 goes to the outside, during cold weather, it is emptied into the flush tank 861 with the help of a gravity assisted drain (not shown to avoid clutter; can be readily implemented by positioning tank 861 at the low point in the loop). The flush tank 861 as well as the pipe loop 869 can have air release vents 871, 873 to assist gravity drain of water into the flush tank 861. The outdoor anti-freeze solution loop 853 stays partially indoors and partially outdoors. For higher temperature ambient environments, the loop 869 stays operational and the outdoor anti-freeze solution loop 853 will stay in an OFF state. On the other hand, for lower temperature ambient environments, water flow is directed through the liquid-to-liquid heat exchanger 899, the anti-freeze solution loop 853 is active, and the air release vents 871, 873 on the loop 869 and flush tank 861 are opened to empty the coolant from the loop 869 into the flush tank. Fluid temperature sensor 807 represents one or more sensors which measure the coolant temperature of the water in loop 869 or glycol or the like in loop 853, as the case may be. The working of this particular implementation is schematically explained through FIGS. 9-14.

Figure 9:
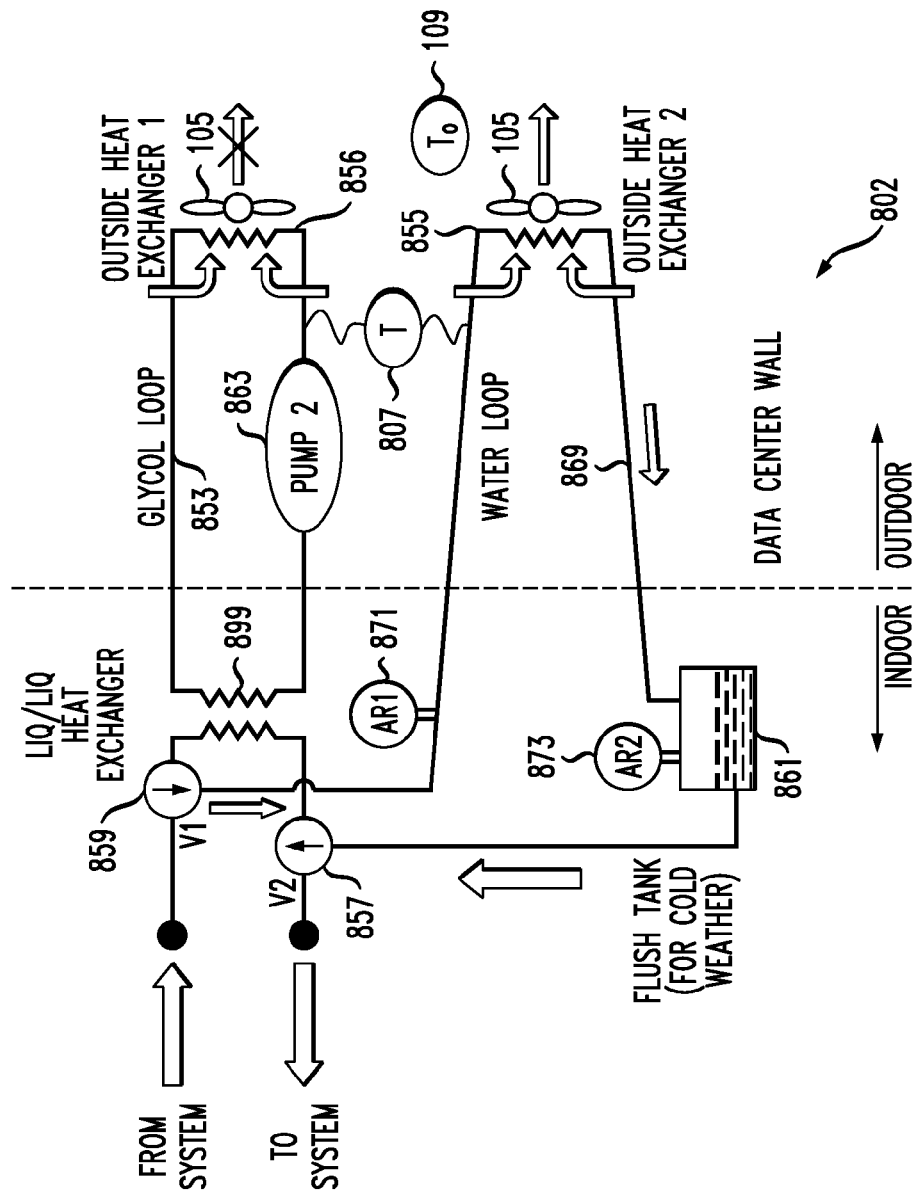
FIGS. 9-13 show five stages in operation of the system of FIG. 8.
Figure 10:
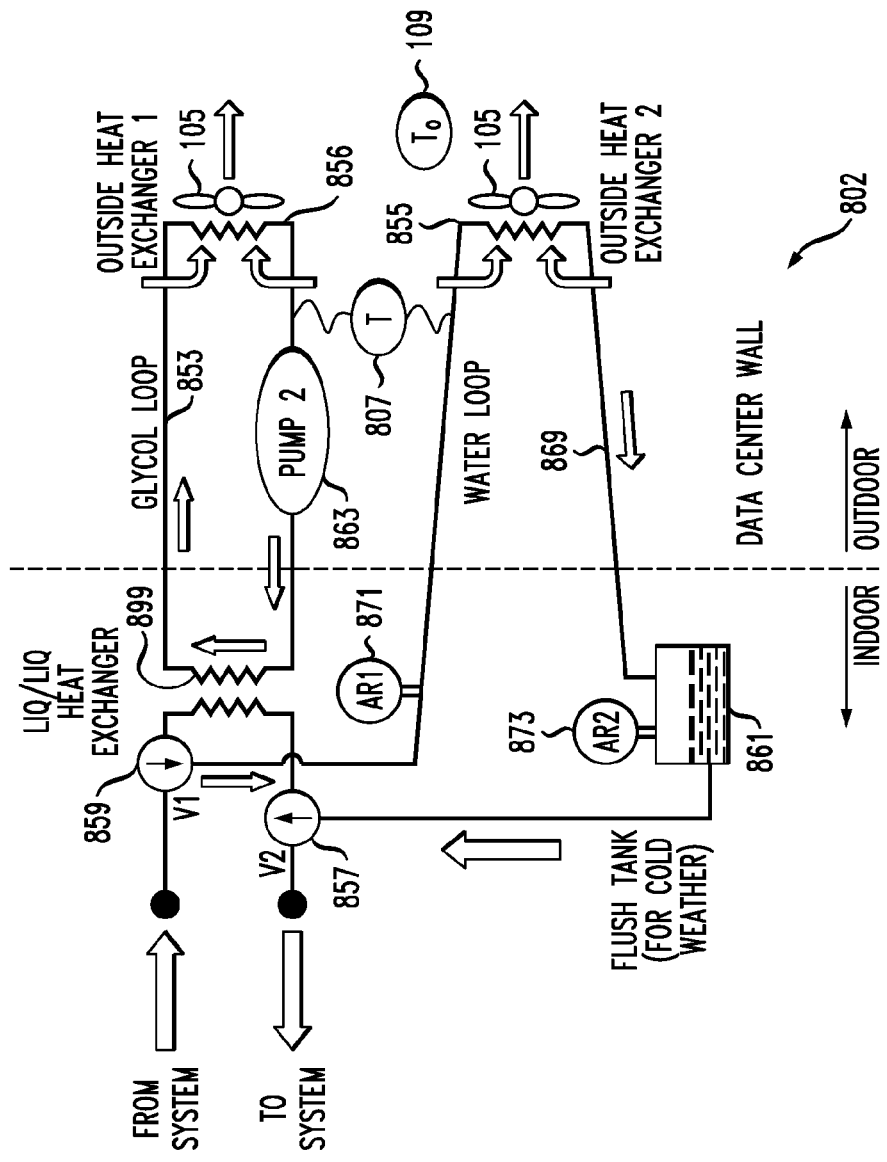
Figure 11:
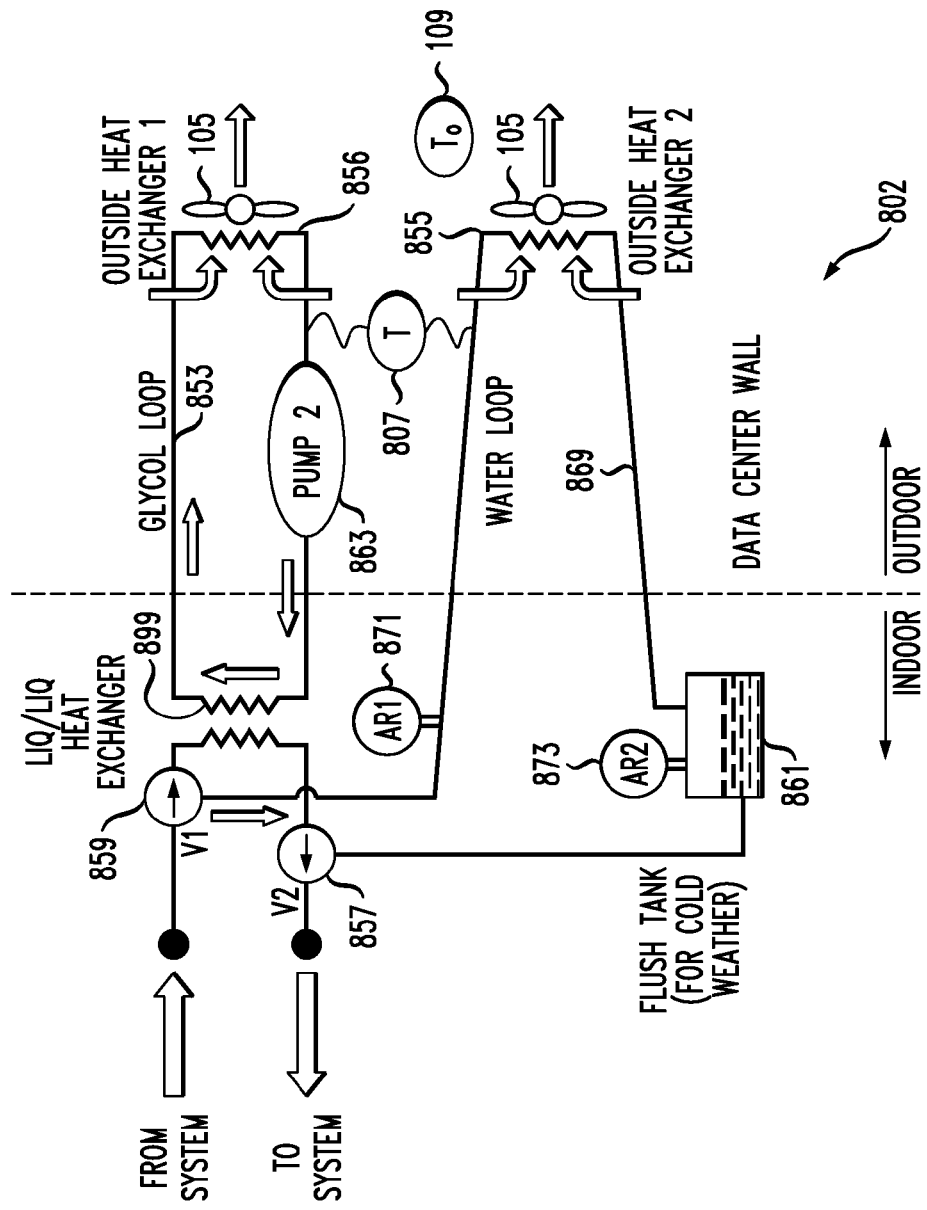
Figure 12:
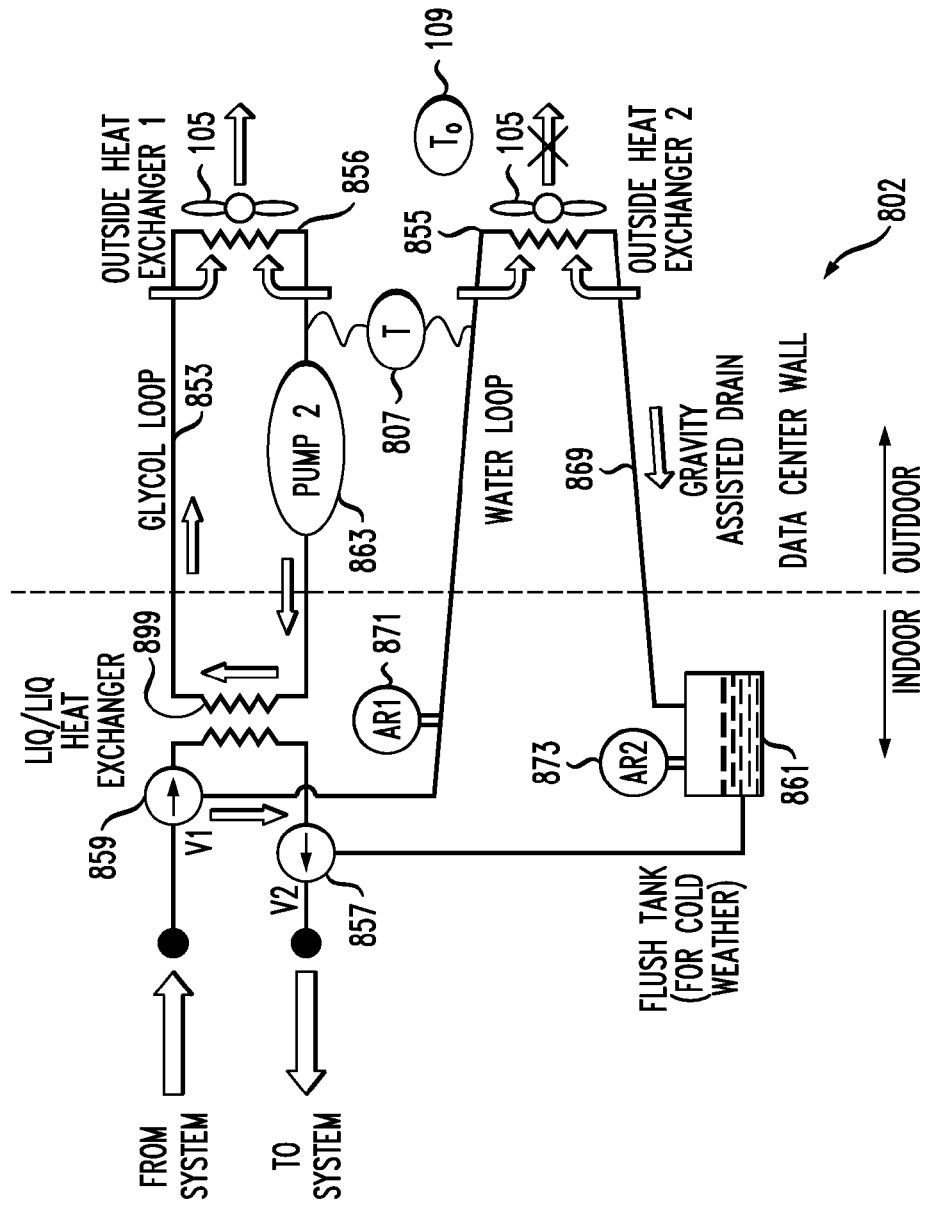

FIG. 9 represents Stage A which is normal system operation stage with a high thermal performance coolant (Water) loop operation. In this stage, the 3-Way control valves 857, 859 are oriented in a way so as to direct the water flow through the loop 869. The air release vents 871, 873 are closed. There is no water flow through the liquid-to-liquid heat exchanger 899. Moreover, the anti-freeze solution loop 853 is not active, i.e., the outside heat exchanger 856 and the pump 863 are shut OFF. FIGS. 10 through 12 represent the anti-freeze solution (Glycol) loop activation. FIG. 10 represents Stage B1 which is the first step in anti-freeze loop activation. At this stage, the pump 863 and outside heat exchanger 856 are powered ON to circulate the flow through the anti-freeze loop 853. The loop 869 is still active, the air release vents 871, 873 are closed, and there is no water flow through the liquid-to-liquid heat exchanger 899.

Figure 13:
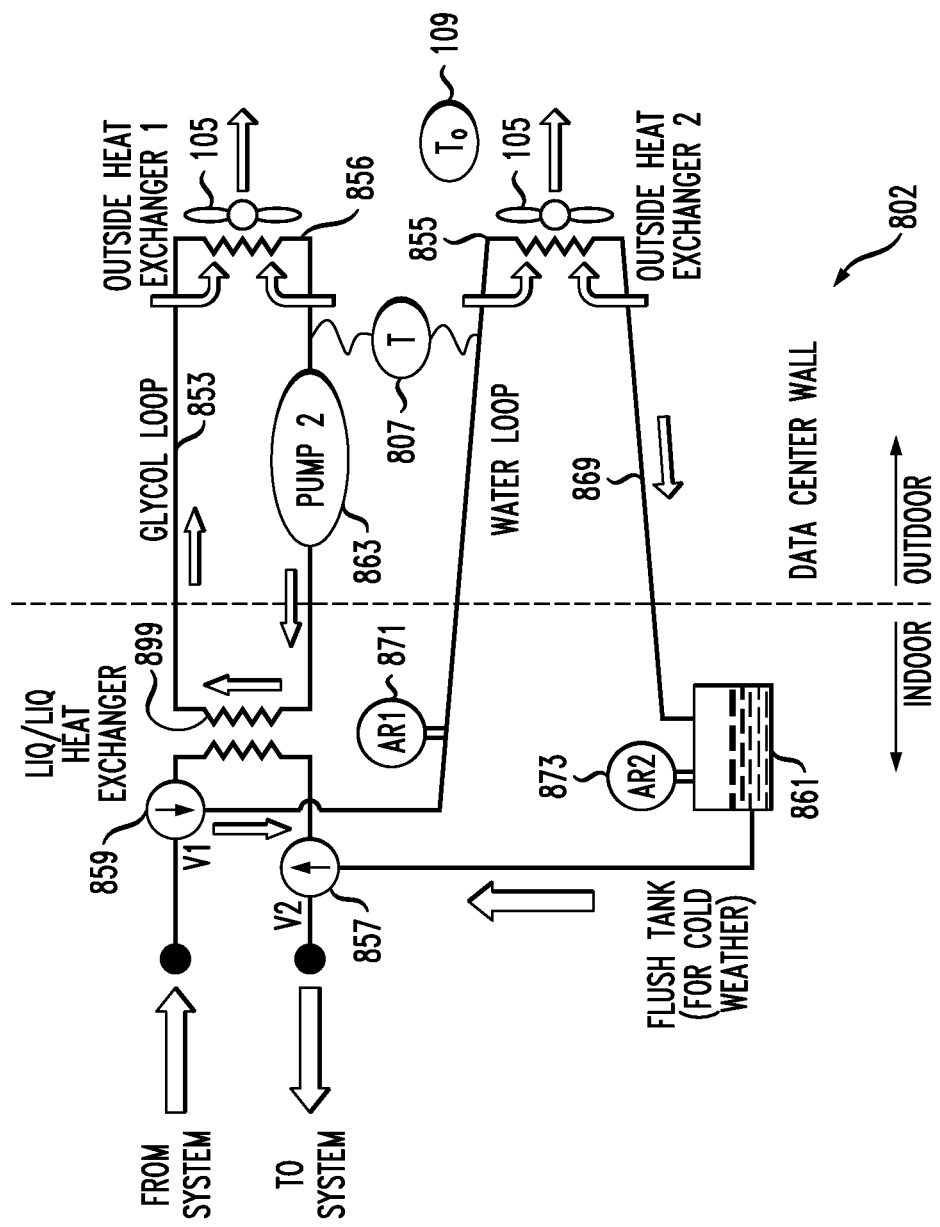

FIG. 11 represents Stage B2 at which the anti-freeze loop 853 is completely active and the three-way valves 857, 859 are turned to direct the water flow through the liquid-to-liquid heat exchanger 899. At this stage, the outside heat exchanger 855 is still powered ON and the air release vents 871, 873 are still closed. FIG. 12 represents stage B3 at which the anti-freeze loop 853 is completely active, the three-way valves 857, 859 are completely turned to direct the flow through the liquid-to-liquid heat exchanger 899, the outside heat exchanger 855 is powered OFF and the air release vents 871, 873 are opened to assist gravity drain of water into the flush tank 861. The only flow in the loop 869 is due to water dripping down into the flush tank 861 by gravity. FIG. 13 represents Stage C at which the water through the loop 869 is activated. At this stage, all the air release vents 871, 873 are closed, the outside heat exchanger 855 is powered ON and the three-way valves 857, 859 are turned to direct the water flow through the loop 869. The Glycol loop 853 is still active with the pump 863 and outside heat exchanger 856 powered ON. The completely active loop 869 is the same as stage A (FIG. 9).

Figure 14:
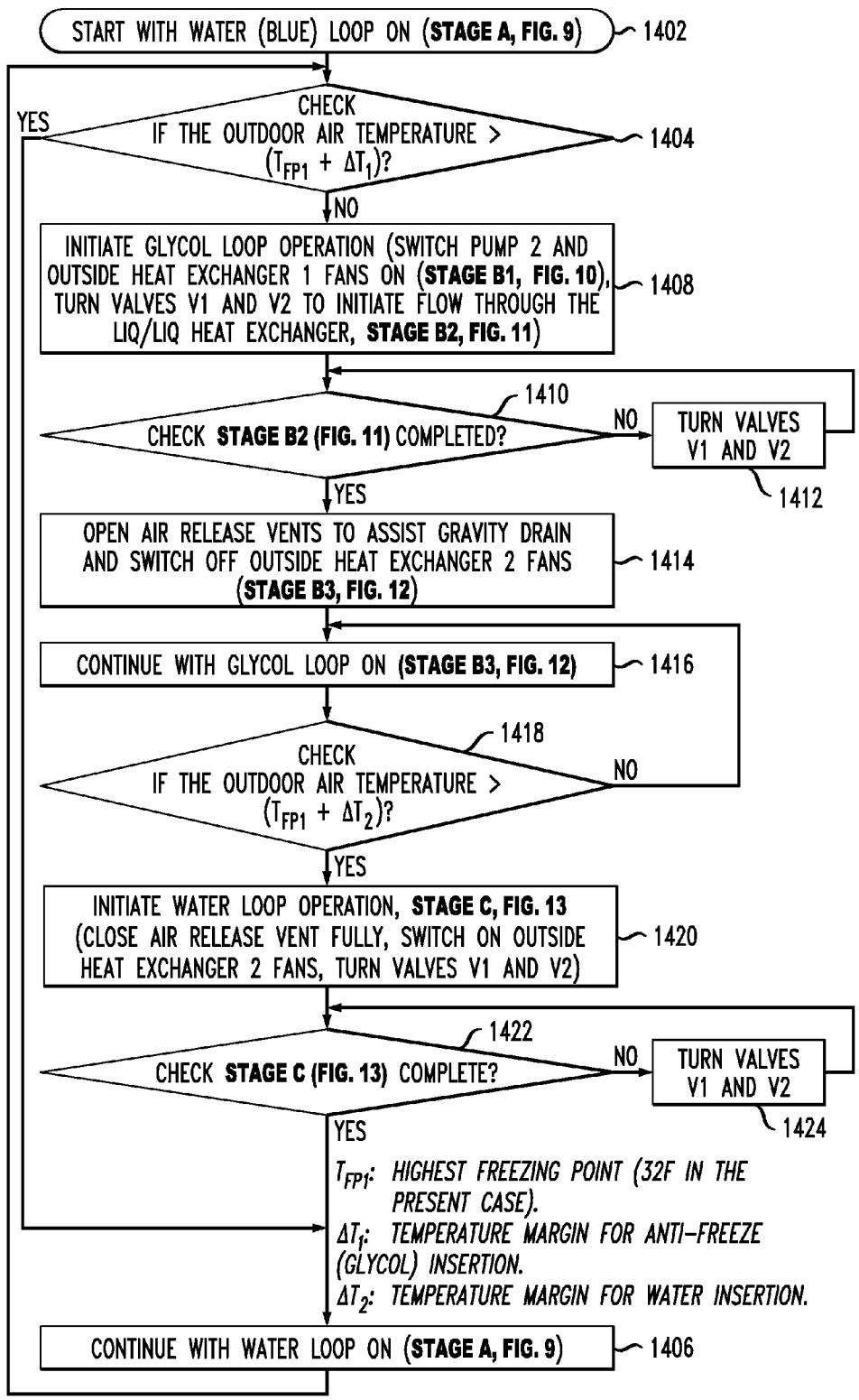
FIG. 14 shows a flow chart for operation of the system of FIG. 8.

FIG. 14 is a flowchart that explains the working of the coolant switch system presented in FIG. 8 based on the outdoor air temperature. The cooling system can be initiated from any stage, however for simplicity; Stage A (FIG. 9) is represented as the initial state of the cooling system, as at 1402. The outdoor air temperature is constantly monitored with sensor 109, as indicated at 1404, and based on this temperature the exemplary coolant switch process can be activated. In particular, if the outdoor air temperature is greater than the freezing point $T_{FP1}$ of water or other high performance coolant, plus a suitable safety margin $\Delta T_1$, as per the "Y" branch of block 1404, continue with water or other high performance coolant in the loop, as at 1406, and continue to monitor.

When the outdoor air temperature drops below a certain temperature check point ($T_{FP1}+\Delta T_1$), the anti-freeze solution (Glycol) loop activation stage (Stage B1, FIG. 10) is initiated, at 1408, from the "N" branch of block 1404, by powering pump 863 and outside heat exchanger 856 ON. Once the anti-freeze solution circulation is completely active, the next stage (stage B2, FIG. 11) is activated by turning the 3-way valves so as to direct the water flow through the liquid/liquid heat exchanger, as also indicated in step 1408. At this stage, the outside heat exchanger 855 is still powered ON and the air release vents 871, 873 are still closed. Once the three-way valves are completely turned, the next stage (Stage B3, FIG. 12) is activated as indicated at step 1414 from the "Y" branch of block 1410. Note that if it was determined in step 1410 that Stage B2 was not complete, the turning of the valves would have continued in step 1412, "N" branch of block 1410. For the avoidance of doubt, note that in step 1410, the position of the 3-way valves is actively monitored. If the desired position of the valves is not achieved, the turning of the valves is continued (step 1412). Once the desired position of the 3-way valves is achieved, the next stage is activated In Stage B3, the anti-freeze loop is completely active, the three-way valves 857, 859 are completely turned to direct the flow through the liquid-to-liquid heat exchanger 899, the outside heat exchanger 855 is powered OFF and the air release vents 871, 873 are opened to assist gravity drain of water into the flush tank 861. The only flow in the loop 869 is due to water dripping down into the flush tank 861 by gravity. As indicated at 1416, the cooling system operates at this stage until the outdoor air temperature goes above a certain temperature check point ($T_{FP1}+\Delta T_2$), as determined at 1418 (if not ("N" branch), continue checking; if so ("Y" branch), proceed to 1420). When the outdoor air temperature goes above this temperature check point ($T_{FP1}+\Delta T_2$), loop 869 activation stage (Stage C, FIG. 13) is started, as at 1420, by closing all the air release vents 871, 873, powering ON the outside heat exchanger 855 and turning the three-way valves 857, 859 to direct the water flow through the loop 869.

At this stage, the Glycol loop 853 is still active with the pump 863 and outside heat exchanger 856 powered ON. Once the loop 869 is completely operational, "Y" branch of block 1422, the glycol loop is turned OFF by powering the pump 863 and outside heat exchanger 856 OFF. In step 1422, the position of the 3-way valves is actively monitored. If the desired position of the valves is not achieved, the turning of the valves is continued (step 1424). Once the desired position of the 3-way valves is achieved, the next stage is activated at 1406. For the avoidance of doubt, steps 1412 and 1424 indicate that the valves are actively monitored and controlled.

Moreover, at this next stage, there is no water and glycol flow through the liquid-to-liquid heat exchanger 899. The cooling system operates at this stage, as at 1406, until the outdoor air temperature goes below a certain temperature check point ($T_{FP1}+\Delta T_1$) as explained above with respect to block 1404. Once started, the process repeats itself based on the outdoor air temperature. This coolant switching operation can either take place for two or more times per year depending upon location of the system, weather conditions of the location and other environmental factors.

Figure 15:
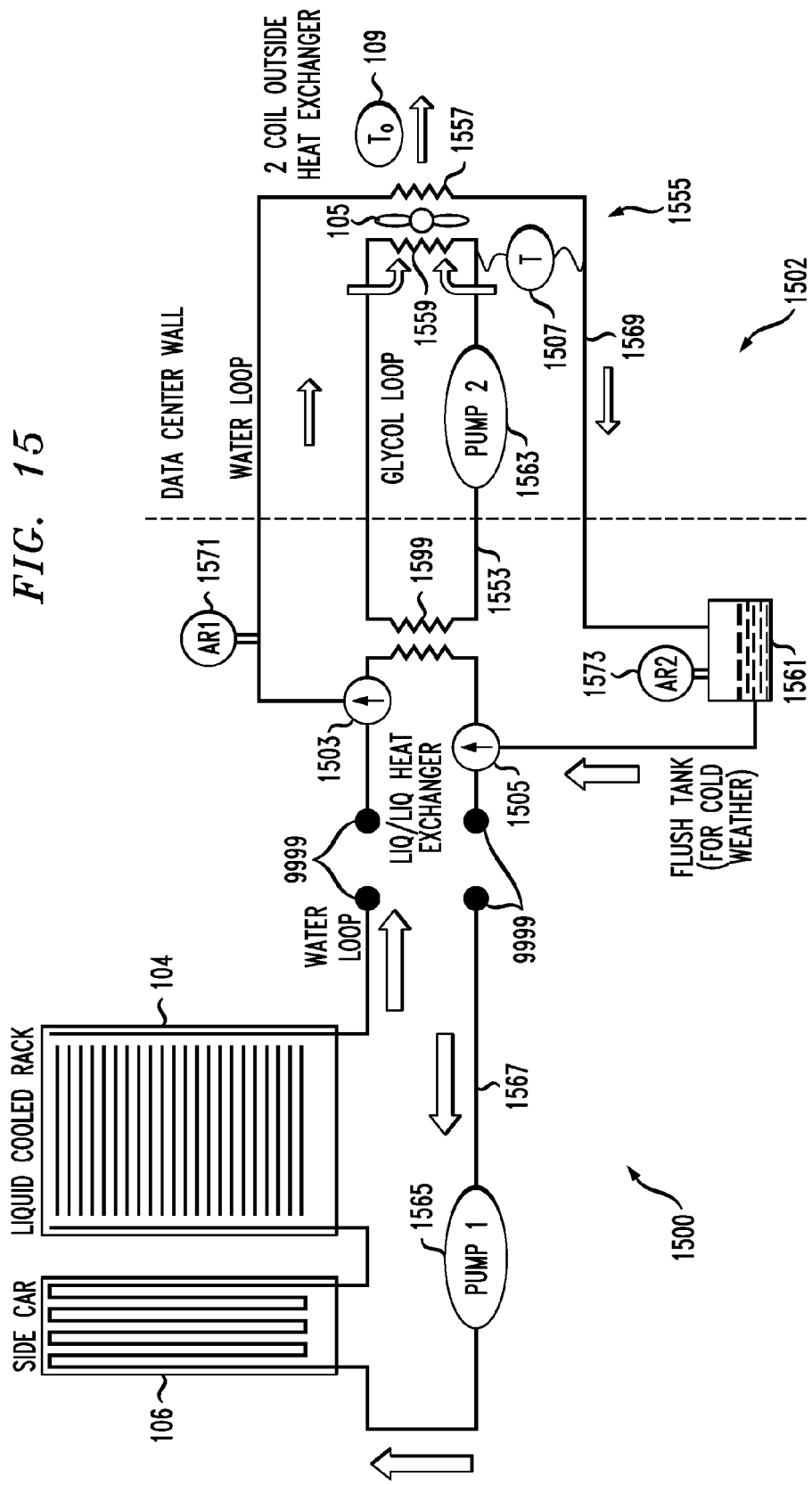
FIG. 15 shows a further exemplary data center liquid cooling system, according to an aspect of the invention.

FIG. 15 schematically represents another method of implementing the coolant switching concept in a liquid cooled data center 1500 with an air-side economizer 1502. This configuration is somewhat similar to the configuration shown in FIG. 8 and uses a similar process to switch between the coolants. However, this configuration uses only one outside heat exchanger unit 1555 with two liquid side coils. One liquid coil 1557 is for the water loop and the other liquid coil 1559 is for the anti-freeze solution. Moreover, in this process, there is no possible mixing and/or physical interaction between the two coolants as the two coolants run inside different cooling loops. This scheme requires a partial water (high thermal performing coolant) cooling loop 1569 with an additional coil in the outside heat exchanger (water coil 1557) and two 3-Way valves 1503, 1505 in addition to the indoor- and outdoor-cooling loops. The two 3-Way valves help toggle the flow in the loop 1569. The system being cooled includes a liquid cooled rack 104 and a side car segment 106 and is present inside the data center 1500. In addition, the indoor components of this design include a liquid/liquid heat exchanger 1599, a water (high thermal performance coolant) flush tank 1561 and two 3-way valves 1503, 1505. The presence of a liquid/liquid heat exchanger helps de-couple the cooling loops into a high thermal performance coolant (water) loop 1567, 1569 and outdoor anti-freeze solution (Glycol) loop 1553. However, having two cooling loops necessitates the installment of an additional pump 1563 in the outdoor anti-freeze solution (Glycol) loop 1553.

As depicted in FIG. 15, the water loop has two parts—one 1567 that stays completely inside the data center housing and the other 1569 that goes to the outside. Since the loop 1569 goes to the outside, during cold weather, it is emptied into the flush tank 1561 with the help of a gravity assisted drain (not explicitly shown; can be achieved by locating tank 1561 at the low point of the water loop). The flush tank 1561 and the loop 1569 have air release vents 1571, 1573 to assist gravity drain of water into the flush tank. The outdoor anti-freeze solution loop 1553 stays partially indoor and partially outdoor. For higher temperature ambient environments, the loop 1569 will stay operational and the outdoor anti-freeze solution loop 1553 will stay in an OFF state. On the other hand, for lower temperature ambient environments, water flow will be directed through the liquid-to-liquid heat exchanger 1599, the anti-freeze solution loop 1553 will be active and the air release vents 1571, 1573 on the loop 1569 and flush tank 1561 will be opened to empty the coolant from the loop 1569 into the flush tank 1561. Fluid temperature sensor 1507 represents one or more sensors which measure the coolant temperature of the water in loop 1569 or glycol or the like in loop 1553, as the case may be. The working of this particular implementation is schematically explained through figures FIG. 16-FIG. 21. In FIG. 15, note also the pump 1565 for the water loop 1567, 1569.

Figure 16:
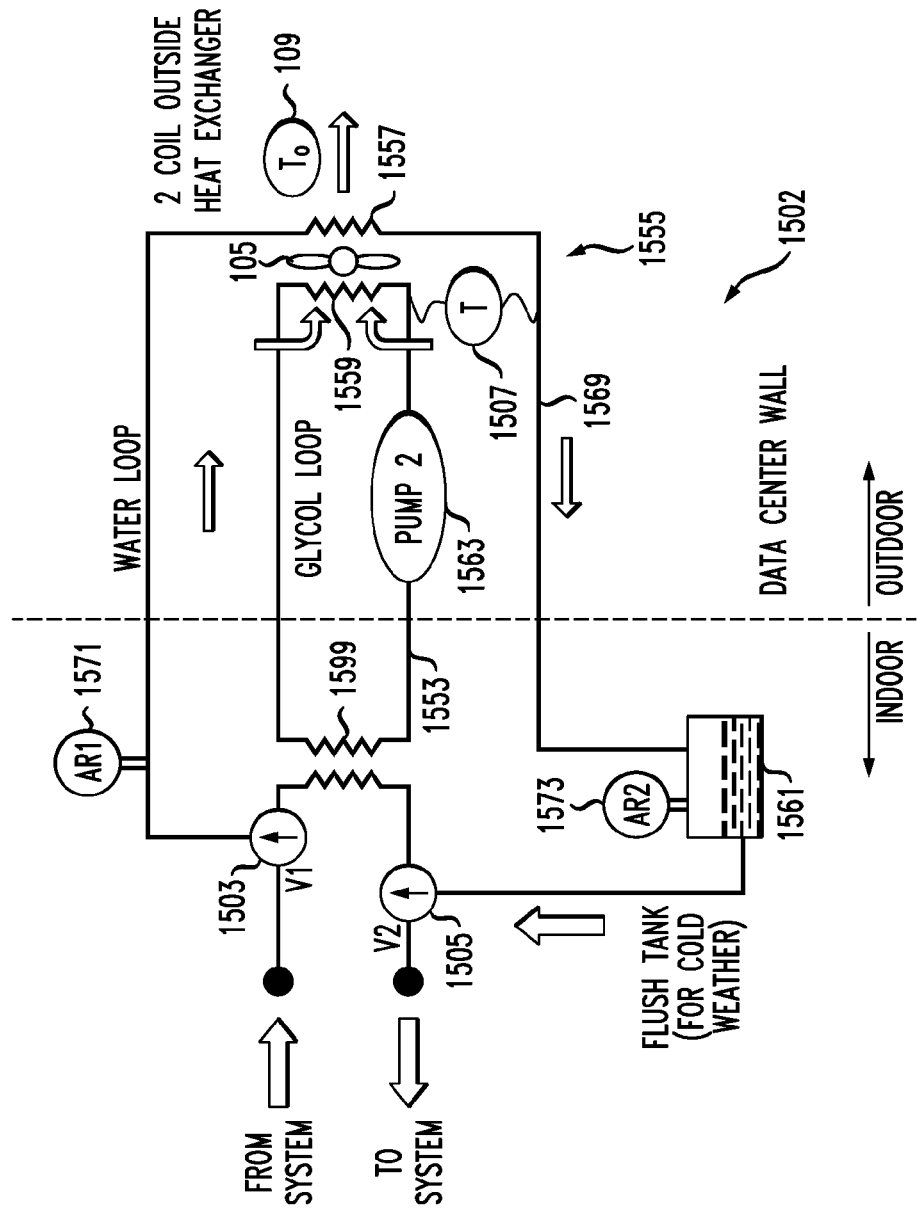
FIGS. 16-20 show five stages in operation of the system of FIG. 15.
Figure 17:
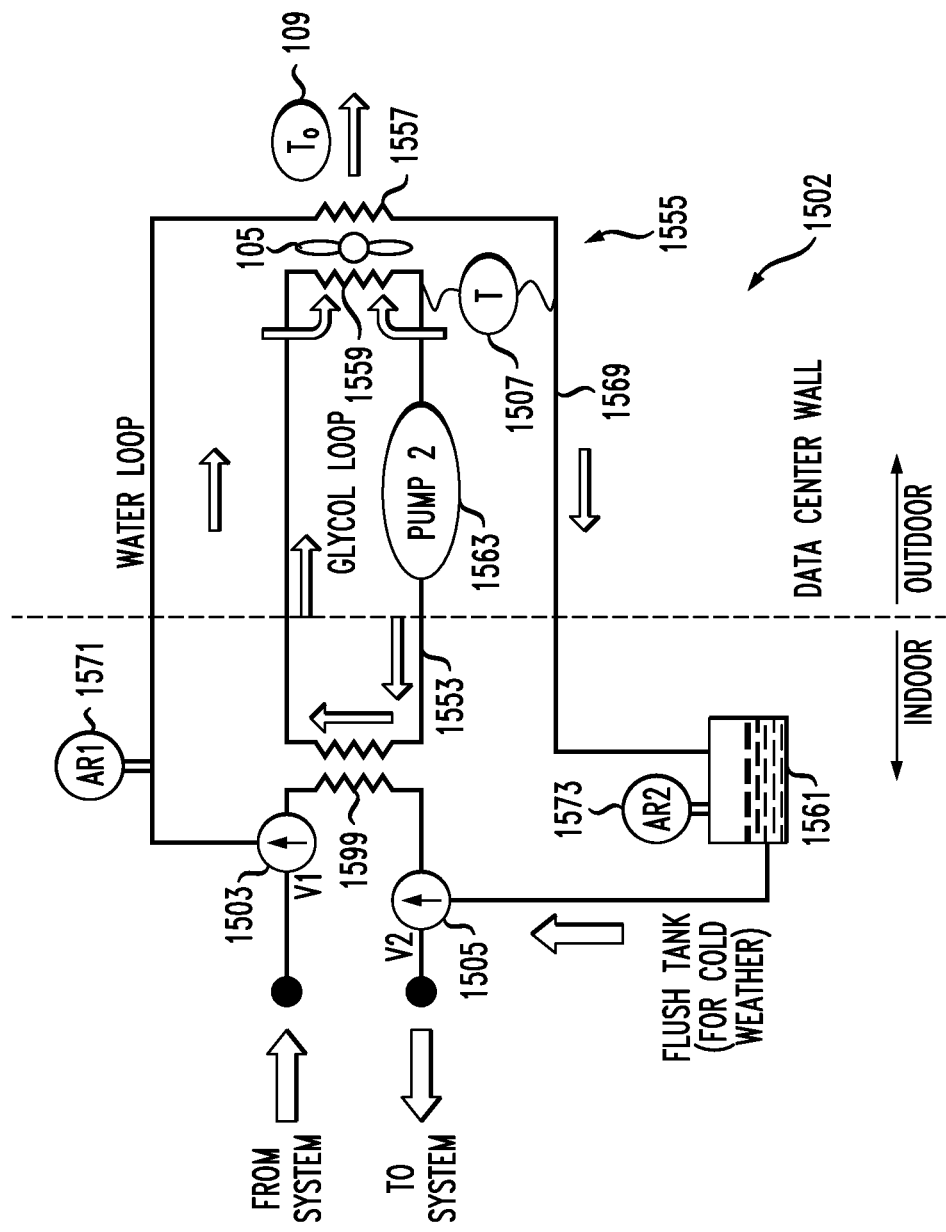
Figure 18:
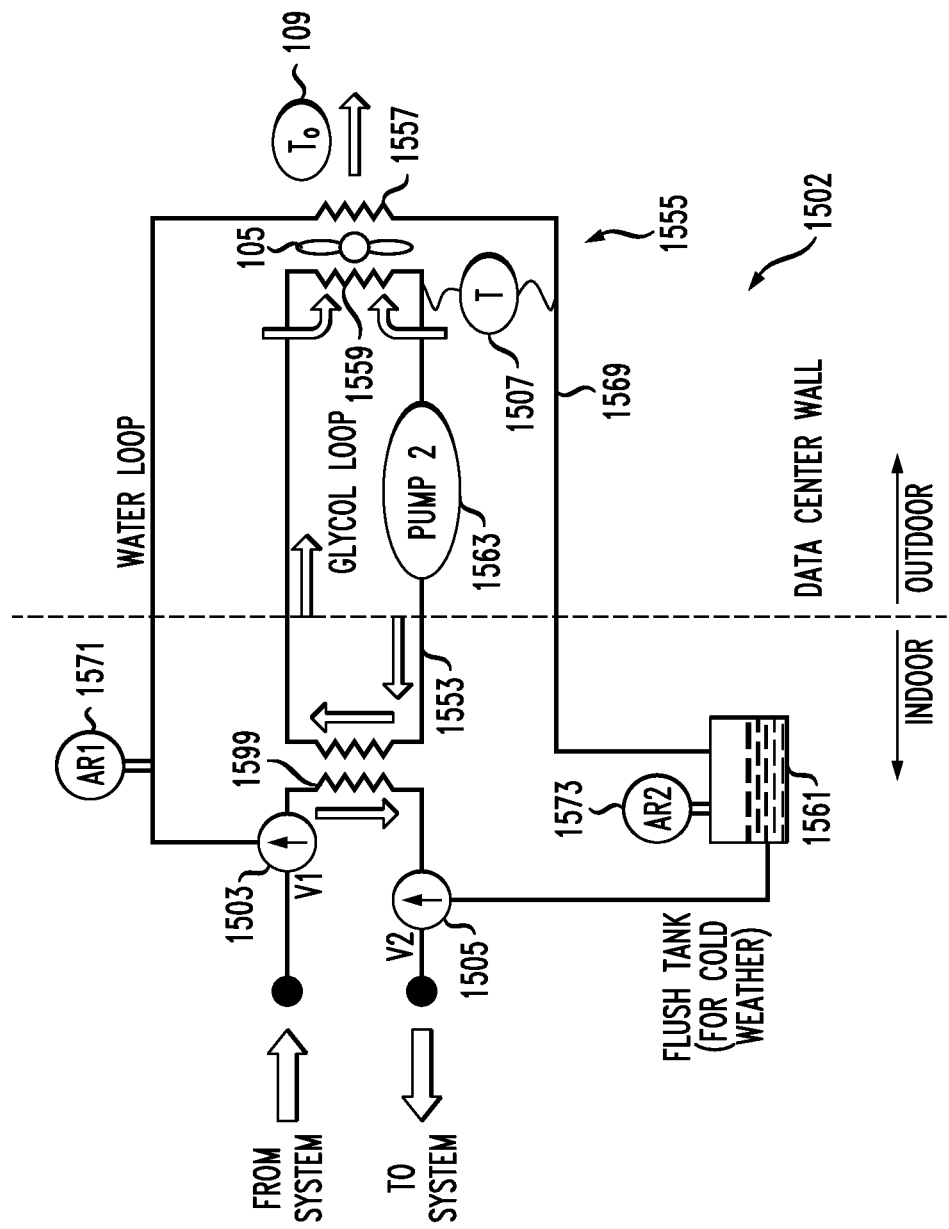
Figure 19:
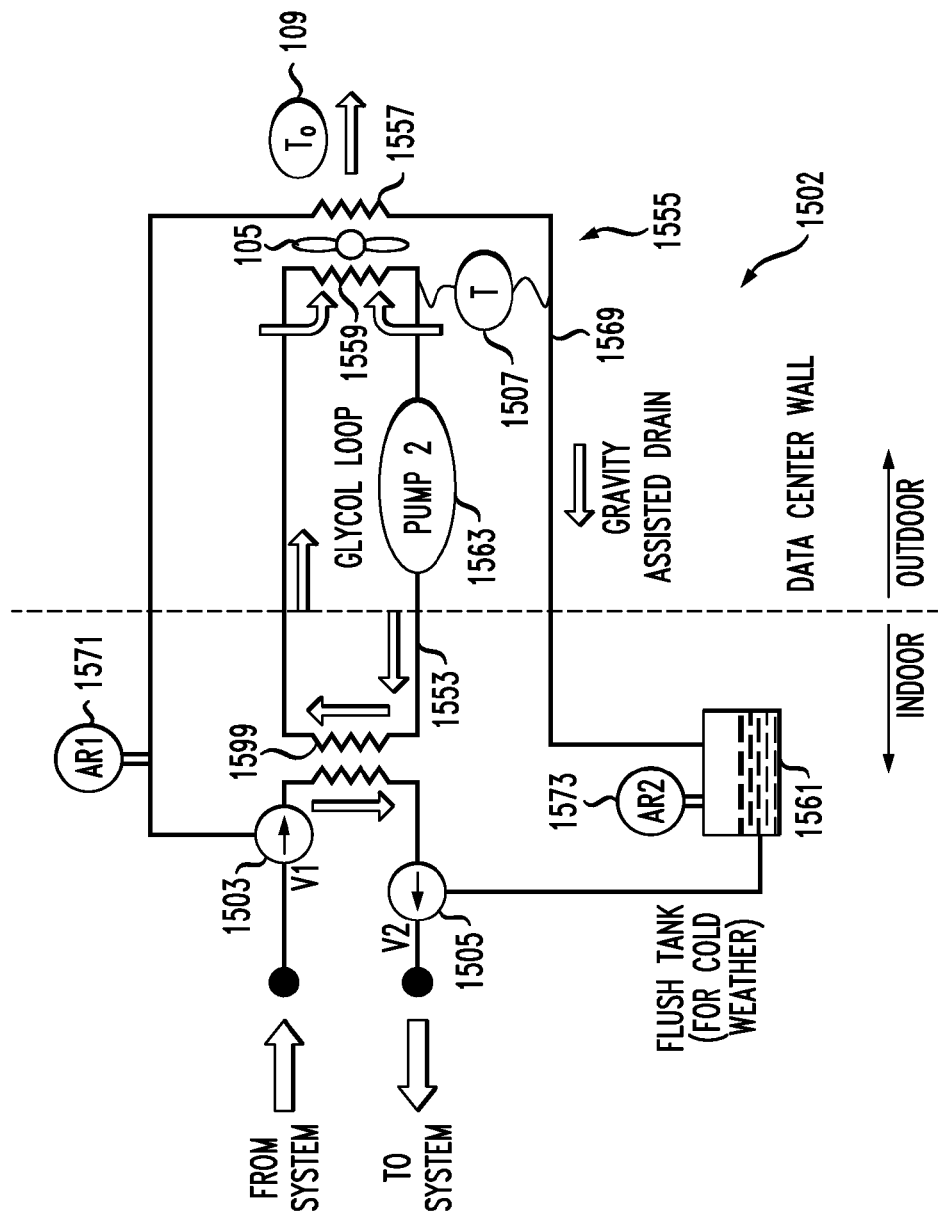
Figure 20:
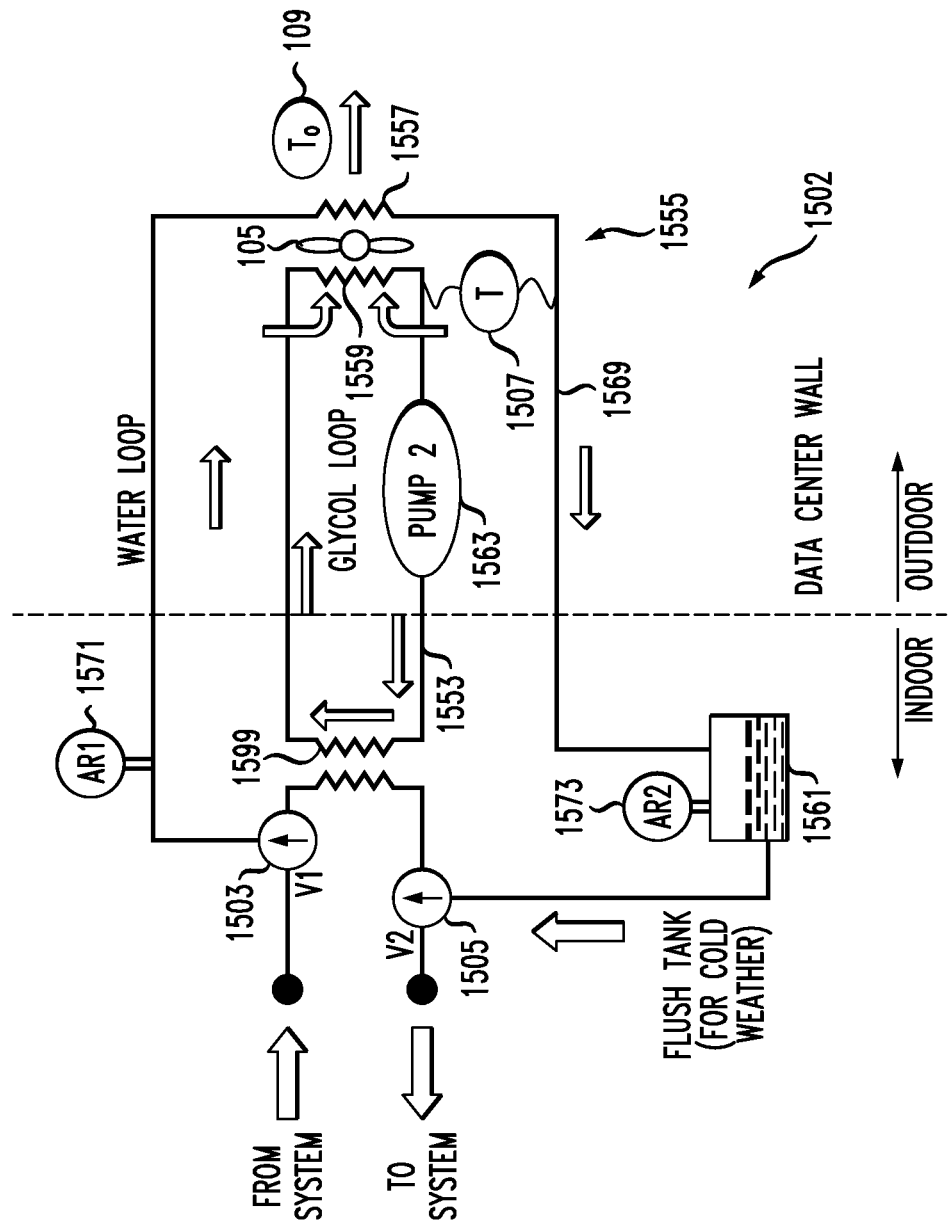

FIG. 16 represents Stage (i) which is a normal system operation stage with high thermal performance coolant (Water) loop operation; i.e., loop 1569 operates. In this stage, the 3-way control valves 1503, 1505, are oriented in a way so as to direct the water flow through the loop 1569. The air release vents 1571, 1573 on the loop 1569 and on the flush tank 1561 are closed. There is no water flow through the liquid-to-liquid heat exchanger 1599. Moreover, the anti-freeze solution loop 1553 is not active, i.e., the pump 1563 is shut OFF. FIGS. 17-19 represent the anti-freeze solution (Glycol) loop 1553 activation. FIG. 17 represents Stage (iiA) which is the first step in anti-freeze loop activation. At this stage, the pump 1563 is powered ON to circulate the flow through the anti-freeze loop 1553. The loop 1569 is still active, the air release vents 1571, 1573 are closed and there is no water flow through the liquid-to-liquid heat exchanger 1599. FIG. 18 represents Stage (iiB) at which the anti-freeze loop 1553 is completely active and the three-way valves 1503, 1505 are turned to direct the water flow through the liquid-to-liquid heat exchanger 1599. At this stage, the air release vents 1571, 1573 are still closed. FIG. 19 represents stage (iiC) at which the anti-freeze loop 1553 is completely active, the three-way valves 1503, 1505 are completely turned to direct the flow through the liquid-to-liquid heat exchanger 1599 and the air release vents 1571, 1573 are opened to assist gravity drain of water into the flush tank 1561. The only flow in the loop 1569 is due to water dripping down into the flush tank 1561 due to gravity. FIG. 20 represents Stage (iii) at which the water through the loop 1569 is activated. At this stage, all the air release vents 1571, 1573 are closed and the three-way valves 1503, 1505 are turned to direct the water flow through the loop 1569. The Glycol loop 1553 is still active with the pump 1563 and outside heat exchanger 1559 with fan 105 powered ON. The completely active loop 1569 is the same as stage (i) in FIG. 16.

Figure 21:
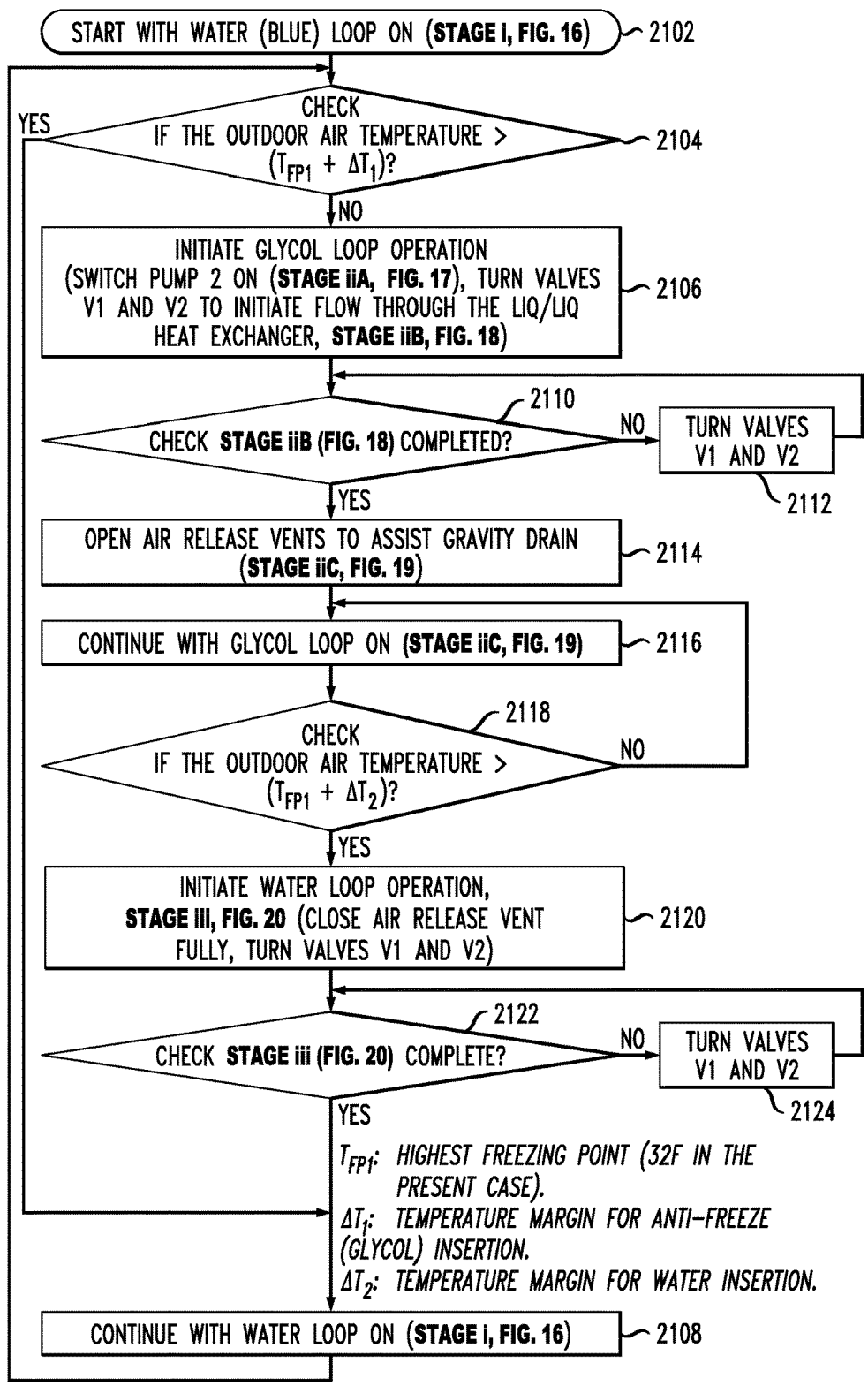
FIG. 21 shows a flow chart for operation of the system of FIG. 15.

FIG. 21 is a flowchart that explains the working of the coolant switch system presented in FIG. 15 based on the outdoor air temperature. The cooling system can be initiated from any stage, however for simplicity; Stage (i), FIG. 16, is represented as the initial state of the cooling system, as at 2102. The outdoor air temperature is constantly monitored with sensor 109; based on this temperature the coolant switch process can be activated. As shown at 2104, when the outdoor air temperature drops below a certain temperature check point ($T_{FP1}+\Delta T_1$), the anti-freeze solution (Glycol) loop activation stage (Stage iiA, FIG. 17) is initiated by powering pump 1563 ON, as at 2106 ("N" branch of decision block 2104). If decision block 2104 yields a "Y," simply continue with the water loop ON as per 2108.

Once the anti-freeze solution circulation is completely active ("Y" branch of decision block 2110; if block 2110 yields an "N," then turn the valves at 2112), the next stage (stage (iiB), FIG. 18) is activated by turning the three-way valves 1503, 1505 so as to direct the water flow through the liquid-to-liquid heat exchanger 1599. At this stage, the air release vents 1571, 1573 are still closed. Once the three-way valves 1503, 1505 are completely turned, the next stage (Stage (iiC), FIG. 19) is activated, at step 2114. At this stage, the anti-freeze loop 1553 is completely active, the three-way valves 1503, 1505 are completely turned to direct the flow through the liquid-to-liquid heat exchanger 1599, and the air release vents 1571, 1573 are opened to assist gravity drain of water into the flush tank 1561. The only flow in the loop 1569 is due to water dripping down into the flush tank 1561 due to gravity.

As shown at 2116, the cooling system operates at this stage until the outdoor air temperature goes above a certain temperature check point ($T_{FP1}+\Delta T_2$), as determined in step 2118. When the outdoor air temperature goes above this temperature check point ($T_{FP1}+\Delta T_2$), as per the "Y" branch of decision block 2118, activation of loop 1569 (Stage (iii), FIG. 20) is started, as at 2120, by closing all the air release vents 1571, 1573 and turning the three-way valves 1503, 1505 to direct the water flow through the loop 1569. (If block 2118 yields an "N" then control passes back to step 2116.) At this stage, the Glycol loop 1553 is still active with the pump 1563. Once the loop 1569 is completely operational, as monitored at steps 2122 and 2124, the glycol loop 1553 is turned OFF by powering pump 1563 OFF. Moreover, at this stage, there is no water and glycol flow through the liquid-to-liquid heat exchanger 1599. The cooling system operates at this stage, as per 2108, until the outdoor air temperature goes below a certain temperature check point ($T_{FP1}+\Delta T_1$). Once started, the process repeats itself based on the outdoor air temperature. This coolant switching operation can either take two or more times a year depending upon location of the system, weather conditions of the location and other environmental factors. Steps 2110, 2112 and 2122, 2124 represent an active monitoring of the valves, similar to steps 1410, 1412 and 1422, 1424 as discussed above. It should be noted that other embodiments could possibly use a different approach wherein valve actuation was treated in a binary on-off fashion.

One or more embodiments advantageously provide a method of swapping coolants in a given coolant loop using shut-off valves and/or three-way valves. One or more instances provide the ability to use different (possibly miscible) coolants in the same cooling loop. Four non-limiting exemplary illustrative embodiments for liquid cooling one or more data center racks have been disclosed, as has a control algorithm for the coolant swapping process based on the ambient temperature. High thermal performance coolant (e.g., water) will be used during the high temperature portion of the year while relatively low thermal performance coolant (e.g., glycol or other antifreeze-based solution) will be used during the low temperature portion of the year.

For the avoidance of doubt, one or more embodiments swap between two separate coolants and do not merely employ two phases (such as liquid and vapor) of the same coolant in the same loop. Furthermore, at least some embodiments employ single-phase (liquid) cooling only.

Given the discussion thus far, it will be appreciated that, in general terms, an exemplary method (e.g., FIGS. 6, 14, 21), according to an aspect of the invention, includes the step of operating a data center cooling system 100, 800, 1500 in a first mode, as at 602, 1402, 2102. The data center cooling system has an indoor portion wherein heat is absorbed from components (e.g., 104, 106) in the data center. The data center cooling system has an outdoor heat exchanger portion 102, 802, 1502) wherein outside air is used to cool a first heat transfer fluid (e.g., water) present in at least the outdoor heat exchanger portion of the cooling system during the first mode. The first heat transfer fluid is a relatively high performance heat transfer fluid (as compared to the second fluid). The first heat transfer fluid has a first heat transfer fluid freezing point (32 F or 0 C in the case of water).

For the avoidance of doubt, the outdoor economizer portions depicted in the figures include a heat exchanger and a fan. However, some embodiments could employ outdoor heat exchanger portions without fans. As used in the claims, an "outdoor heat exchanger portion" is intended to encompass both an outdoor heat exchanger with a fan (economizer) and an outdoor heat exchanger without a fan.

Another step, e.g., 604, 1404, 2104, includes determining that an appropriate time has been reached to switch from the first mode to a second mode. In a non-limiting example, this determination could include monitoring an outdoor air temperature 109 adjacent the outdoor heat exchanger portion of the data center cooling system to determine whether the outdoor air temperature has reached a first predetermined relationship with the first heat transfer fluid freezing point.

A further step, as at 608, 1408, 2106 includes, responsive to the determining step (again, purely by way of example and not limitation, outdoor air temperature reaching the first predetermined relationship with the first heat transfer fluid freezing point), switching the outdoor heat exchanger portion of the data cooling system to a second heat transfer fluid (e.g., an antifreeze such as ethylene glycol or an antifreeze-water mixture, such as an ethylene glycol-water mixture), in preparation for operation in the second mode. The second heat transfer fluid is a relatively low performance heat transfer fluid, as compared to the first heat transfer fluid. The second heat transfer fluid has a second heat transfer fluid freezing point lower than the first heat transfer fluid freezing point, and the second heat transfer fluid freezing point is sufficiently low to operate without freezing when the outdoor air temperature drops below a first predetermined relationship with the first heat transfer fluid freezing point.

Further optional steps include, as at 616, 1416, 2116, operating the data center cooling system in the second mode, wherein the outside air is used to cool the second heat transfer fluid present in at least the outdoor heat exchanger portion of the cooling system during the second mode; and, as at 618, 1418, 2118, determining that an appropriate time has been reached to switch from the second mode back to the first mode (purely by way of example and not limitation, monitoring the outdoor air temperature (the use of a definitive article before "outdoor air temperature" means the air temperature in the same region; of course it will not necessarily have the same value) adjacent the outdoor heat exchanger portion of the data center cooling system to determine whether the outdoor air temperature has reached a second predetermined relationship with the first heat transfer fluid freezing point). A still further optional step 620, 1420, 2120 includes, responsive to the determining that the appropriate time has been reached to switch from the second mode back to the first mode, switching the outdoor heat exchanger portion of the data cooling system back to the first heat transfer fluid.

In some instances, such as shown in FIG. 1, the data center cooling system includes a single loop passing through the data center to the outdoor heat exchanger portion 102, a first tank 108 to store the first heat transfer fluid, a second tank 110 to store the second heat transfer fluid, and a valve arrangement 112, 114, 116, 118, 120; as described above, the valve arrangement is configured to isolate the first and second tanks during steady-state operation, allow the first heat transfer fluid to flow from the single loop into the first tank and the second heat transfer fluid to flow from the second tank into the single loop when transitioning from the first mode to the second mode, and allow the second heat transfer fluid to flow from the single loop into the second tank and the first heat transfer fluid to flow from the first tank back into the single loop when transitioning from the second mode to the first mode. In such cases, the step of switching the outdoor heat exchanger portion of the data cooling system to the second heat transfer fluid includes actuating the valve arrangement to allow the first heat transfer fluid to flow from the single loop into the first tank and the second heat transfer fluid to flow from the second tank into the single loop when transitioning from the first mode to the second mode, and the step of switching the outdoor heat exchanger portion of the data cooling system back to the first heat transfer fluid includes actuating the valve arrangement to allow the second heat transfer fluid to flow from the single loop into the second tank and the first heat transfer fluid to flow from the first tank back into the single loop when transitioning from the second mode to the first mode.

In some cases, such as shown in FIG. 7, the data center cooling system includes an indoor loop 797 passing through the data center to a liquid-to-liquid heat exchanger 799, an indoor-outdoor loop 795 passing from the liquid-to-liquid heat exchanger to the outdoor heat exchanger portion 102, a first tank 108 to store the first heat transfer fluid, a second tank 110 to store the second heat transfer fluid, and a valve arrangement 112, 114, 116, 118, 120. As described above, the valve arrangement is configured to isolate the first and second tanks during steady-state operation, allow the first heat transfer fluid to flow from the indoor-outdoor loop into the first tank and the second heat transfer fluid to flow from the second tank into the indoor-outdoor loop when transitioning from the first mode to the second mode, and allow the second heat transfer fluid to flow from the indoor-outdoor loop into the second tank and the first heat transfer fluid to flow from the first tank back into the indoor-outdoor loop when transitioning from the second mode to the first mode. In such cases, the step of switching the outdoor heat exchanger portion of the data cooling system to the second heat transfer fluid includes actuating the valve arrangement to allow the first heat transfer fluid to flow from the indoor-outdoor loop into the first tank and the second heat transfer fluid to flow from the second tank into the indoor-outdoor loop when transitioning from the first mode to the second mode, and the step of switching the outdoor heat exchanger portion of the data cooling system back to the first heat transfer fluid includes actuating the valve arrangement to allow the second heat transfer fluid to flow from the indoor-outdoor loop into the second tank and the first heat transfer fluid to flow from the first tank back into the indoor-outdoor loop when transitioning from the second mode to the first mode.

In some embodiments, such as FIG. 8 or 15, the data center cooling system includes a first heat transfer fluid indoor loop 867, 1567 passing through the data center; a liquid-to-liquid heat exchanger 899, 1599 selectively coupled to the first heat transfer fluid indoor loop; a first heat transfer fluid indoor-outdoor loop 869, 1569 selectively connectable to the first heat transfer fluid indoor loop and coupled to the outdoor heat exchanger portion; and a second heat transfer fluid loop 853, 1553 passing from the liquid-to-liquid heat exchanger to the outdoor heat exchanger portion. Also included is a valve arrangement 857, 859, 1505, 1503 configured to couple the first heat transfer fluid indoor loop to the first heat transfer fluid indoor-outdoor loop during steady-state operation in the first mode; and couple the first heat transfer fluid indoor loop to the liquid-to-liquid heat exchanger during steady-state operation in the second mode. The step of switching the outdoor heat exchanger portion of the data cooling system to the second heat transfer fluid includes actuating the valve arrangement to couple the first heat transfer fluid indoor loop to the liquid-to-liquid heat exchanger; and the step of switching the outdoor heat exchanger portion of the data cooling system back to the first heat transfer fluid includes actuating the valve arrangement to couple the first heat transfer fluid indoor loop to the first heat transfer fluid indoor-outdoor loop.

As noted, the determining steps can include monitoring an outdoor air temperature adjacent the outdoor heat exchanger portion of the data center cooling system to determine whether the outdoor air temperature has reached the first predetermined relationship with the first heat transfer fluid freezing point; however, many other approaches are possible, such as determining that a particular calendar day has been reached, making a determination based on local meteorological data, and the like. Similar considerations apply to the decision to switch back. Indeed, in general, how the choice is made with regard to switching from one coolant to another and then switching back can be carried out in many different ways, such as by calendar, peak or average daily temperature, or any other suitable method. Furthermore, the predetermined relationships ($\Delta T_{FP1}$ and $\Delta T_{FP2}$) can be chosen, for example, to intend to limit the number of coolant switch cycles to one per year. An example might be the low performance coolant would be switched in when the temperature came within about 10 degrees F. (about 5.6 degrees C.) of the freezing point. It might then be switched out when the daily low temperature exceeded about 20 degrees F. (about 11 degrees C.) over freezing. These are just exemplary numbers which should be chosen utilizing local temperature variations. Alternatively, the low performance coolant could be switched out on one date (say May 15th) and in on another (say October 1st). These could be reversed in the Southern Hemisphere, for example.

Thus, as alluded to, the first determining step can, in some instances, include monitoring an outdoor air temperature adjacent the outdoor heat exchanger portion of the data center cooling system to determine whether the outdoor air temperature has reached a first predetermined relationship with the first heat transfer fluid freezing point, and the second determining step can, in some instances, include monitoring the outdoor air temperature adjacent the outdoor heat exchanger portion of the data center cooling system to determine whether the outdoor air temperature has reached a second predetermined relationship with the first heat transfer fluid freezing point. Again, these are non-limiting examples.

In another aspect, a data center cooling system (FIG. 1, 7, 8, or 15) includes an indoor portion wherein heat is absorbed from components 104, 106 in the data center; and an outdoor heat exchanger portion 102, 802, 1502 wherein outside air is used to cool a first heat transfer fluid present in at least the outdoor heat exchanger portion of the cooling system during a first mode of operation. The first heat transfer fluid is a relatively high performance heat transfer fluid, and the first heat transfer fluid has a first heat transfer fluid freezing point.

A further element is a coolant switch arrangement configured to switch the outdoor heat exchanger portion of the data cooling system to a second heat transfer fluid during a second mode of operation. The second heat transfer fluid is a relatively low performance heat transfer fluid, and the second heat transfer fluid has a second heat transfer fluid freezing point lower than the first heat transfer fluid freezing point. The second heat transfer fluid freezing point is sufficiently low to operate the outdoor heat exchanger portion of the data center cooling system without freezing when the outdoor air temperature drops below a first predetermined relationship with the first heat transfer fluid freezing point.

Some instances also include a control unit coupled to the coolant switch arrangement and configured to determine that an appropriate time has been reached to switch from the first mode to the second mode; in such instances, the coolant switch arrangement switches the outdoor heat exchanger portion of the data cooling system to the second heat transfer fluid responsive to the determination by the control unit. In a non-limiting example, the control unit includes an outdoor air temperature sensor 109 positioned adjacent the outdoor heat exchanger portion of the data center cooling system to determine whether the outdoor air temperature has reached the first predetermined relationship with the first heat transfer fluid freezing point. The sensor could be, for example, a thermocouple or the like coupled to logic in a processor as described below with regard to FIG. 22. Mechanical or electromechanical techniques, such as a bimetallic strip with contacts, could also be used. Appropriate logic, such as described with regard to FIG. 22, could also be used to implement any of the other approaches, such as determining that a particular calendar day has been reached (calendar or clock logic in machine 2212), making a determination based on local meteorological data (e.g., interface to a weather web site or programming based on historical data), and the like.

In one or more embodiments, the coolant switch arrangement is further configured to operate the data center cooling system in the second mode, wherein the outside air is used to cool the second heat transfer fluid present in at least the outdoor heat exchanger portion of the cooling system during the second mode; the control unit is configured to determine that an appropriate time has been reached to switch from the second mode back to the first mode (e.g., outdoor air temperature sensor monitors the outdoor air temperature adjacent the outdoor heat exchanger portion of the data center cooling system to determine whether the outdoor air temperature has reached a second predetermined relationship with the first heat transfer fluid freezing point); and, responsive to the control unit determining that the appropriate time has been reached to switch from the second mode back to the first mode (e.g., outdoor air temperature reaching the second predetermined relationship with the first heat transfer fluid freezing point), the coolant switch arrangement switches the outdoor heat exchanger portion of the data cooling system back to the first heat transfer fluid.

Exemplary first and second heat transfer fluids have been discussed elsewhere.

As seen in FIG. 1, in some cases, the system includes a single loop passing through the data center to the outdoor heat exchanger portion 102; a first tank 108 to store the first heat transfer fluid; and a second tank 110 to store the second heat transfer fluid. In FIG. 1, the coolant switch arrangement includes a valve arrangement 112, 114, 116, 118, 120 configured to isolate the first and second tanks during steady-state operation; allow the first heat transfer fluid to flow from the single loop into the first tank and the second heat transfer fluid to flow from the second tank into the single loop when transitioning from the first mode to the second mode; and allow the second heat transfer fluid to flow from the single loop into the second tank and the first heat transfer fluid to flow from the first tank back into the single loop when transitioning from the second mode to the first mode. This operation is described above.

As seen in FIG. 7, in some cases, the system includes an indoor loop 797 passing through the data center to a liquid-to-liquid heat exchanger 799; an indoor-outdoor loop 795 passing from the liquid-to-liquid heat exchanger to the outdoor heat exchanger portion 102; a first tank 108 to store the first heat transfer fluid; and a second tank 110 to store the second heat transfer fluid. Here, the coolant switch arrangement includes a valve arrangement 112, 114, 116, 118, 120 configured to: isolate the first and second tanks during steady-state operation; allow the first heat transfer fluid to flow from the indoor-outdoor loop into the first tank and the second heat transfer fluid to flow from the second tank into the indoor-outdoor loop when transitioning from the first mode to the second mode; and allow the second heat transfer fluid to flow from the indoor-outdoor loop into the second tank and the first heat transfer fluid to flow from the first tank back into the indoor-outdoor loop when transitioning from the second mode to the first mode.

As seen in FIGS. 8 and 15, in some cases, the system includes a first heat transfer fluid indoor loop 867, 1567 passing through the data center; a liquid-to-liquid heat exchanger 899, 1599 selectively coupled to the first heat transfer fluid indoor loop; a first heat transfer fluid indoor-outdoor loop 869, 1569 selectively connectable to the first heat transfer fluid indoor loop and coupled to the outdoor heat exchanger portion; and a second heat transfer fluid loop 853, 1553 passing from the liquid-to-liquid heat exchanger to the outdoor heat exchanger portion. The coolant switch arrangement includes a valve arrangement 857, 859 configured to couple the first heat transfer fluid indoor loop to the first heat transfer fluid indoor-outdoor loop during steady-state operation in the first mode; and couple the first heat transfer fluid indoor loop to the liquid-to-liquid heat exchanger during steady-state operation in the second mode.

In some cases, such as FIG. 8, the outdoor heat exchanger portion includes a first outside heat exchanger 856 coupled to the second heat transfer fluid loop and a second outside heat exchanger 855 coupled to the first heat transfer fluid indoor-outdoor loop.

In other cases, such as FIG. 15, the outdoor heat exchanger portion comprises a single outside heat exchanger having a first coil 1559 coupled to the second heat transfer fluid loop and a second coil 1557 coupled to the first heat transfer fluid indoor-outdoor loop.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. For the avoidance of doubt, most embodiments include physical heat transfer and fluid flow hardware which may be computer controlled, controlled by humans, controlled by electromechanical and/or bimetallic controllers, and the like; a software embodiment could include, for example, a computer readable storage medium with instructions for system control and/or design functionality.

One or more embodiments of the invention, or elements thereof, can be implemented in the form of an apparatus including a memory and at least one processor that is coupled to the memory and operative to perform exemplary method steps.

Figure 22:
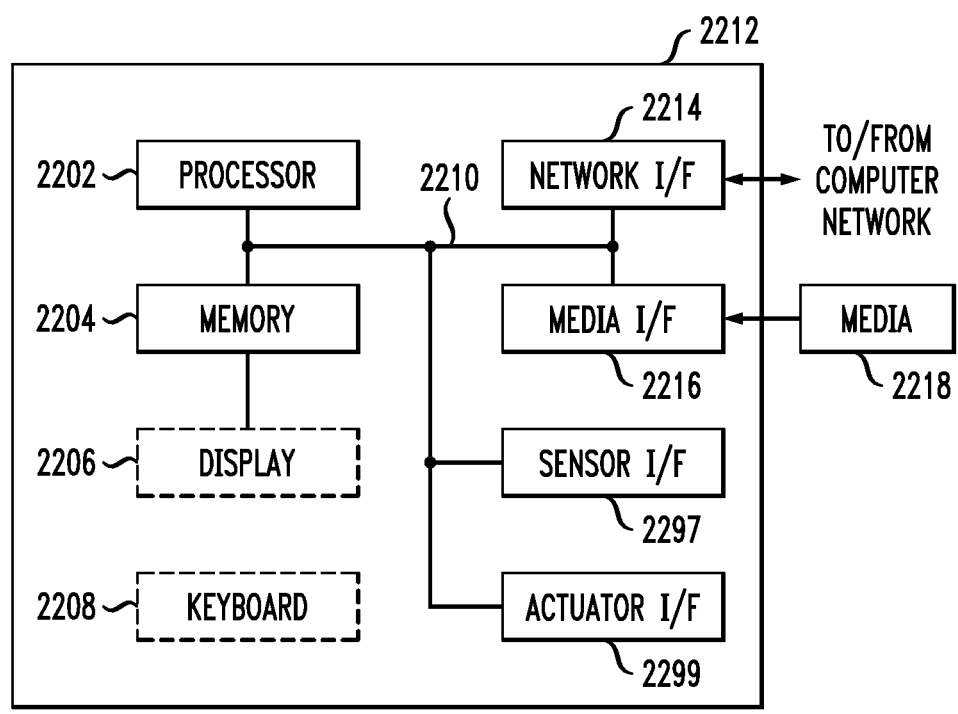
FIG. 22 depicts a computer system that may be useful in implementing one or more aspects and/or elements of the invention.

One or more embodiments can make use of software running on a general purpose computer or workstation. With reference to FIG. 22, such an implementation might employ, for example, a processor 2202, a memory 2204, and an input/output interface formed, for example, by a display 2206 and a keyboard 2208. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 2202, memory 2204, and input/output interface such as display 2206 and keyboard 2208 can be interconnected, for example, via bus 2210 as part of a data processing unit 2212. Suitable interconnections, for example via bus 2210, can also be provided to a network interface 2214, such as a network card, which can be provided to interface with a computer network, and to a media interface 2216, such as a diskette or CD-ROM drive, which can be provided to interface with media 2218.

Suitable interfaces can be provided to receive signals from sensors (e.g., temperature, pressure, flow rate, and/or valve position sensors) and/or to send signals to actuators for valves, vents, fans, and the like. These could be provided over network interface 2214 and/or via separate sensor interface 2297 and/or separate actuator interface 2299, including, for example, suitable digital-to-analog and/or analog-to-digital converters.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 2202 coupled directly or indirectly to memory elements 2204 through a system bus 2210. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 2208, displays 2206, pointing devices, and the like) can be coupled to the system either directly (such as via bus 2210) or through intervening I/O controllers (omitted for clarity).

Network adapters such as network interface 2214 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 2212 as shown in FIG. 22) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 2218 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, one or more distinct software modules for control (e.g., to control the cooling systems using the logic in the flow charts) and/or system design. The method steps can then be carried out, or at least facilitated by, using the distinct software modules and/or sub-modules of the system, as described above, executing on one or more hardware processors 2202. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system for cooling a data center, comprising:
   an indoor portion wherein heat is absorbed from components in said data center during a first mode of operation and during a second mode of operation;
   an outdoor heat exchanger portion wherein outside air is used to cool a first heat transfer fluid present in at least said outdoor heat exchanger portion during said first mode of operation, said first heat transfer fluid being water and having a first freezing point;
   a coolant switch arrangement configured to switch said outdoor heat exchanger portion to a second heat transfer fluid, in preparation for operation in said second mode of operation, said second heat transfer fluid being one of ethylene glycol and an ethylene glycol-water mixture and having a second freezing point lower than said first freezing point, said second freezing point being sufficiently low for said second heat transfer fluid not to freeze when an outdoor air temperature adjacent said outdoor heat exchanger portion drops below a first predetermined relationship with said first freezing point, said second heat transfer fluid has a higher viscosity than said first heat transfer fluid, said second heat transfer fluid having a lower ability to conduct and carry heat than said first heat transfer fluid; and
   a control unit coupled to said coolant switch arrangement and configured to determine that an appropriate time has been reached to switch from said first mode to said second mode,
      wherein said coolant switch arrangement switches said outdoor heat exchanger portion to said second heat transfer fluid responsive to said determination by said control unit, and
      wherein said heat is absorbed from said components in said data center into said second heat transfer fluid and wherein said outside air is used to cool said second heat transfer fluid present in at least said outdoor heat exchanger portion of said cooling system during said second mode;
   said control unit further configured to determine that an appropriate time has been reached to switch from said second mode back to said first mode, wherein the appropriate time is when an outdoor air temperature has reached a second predetermined relationship with the first heat transfer fluid freezing point and, responsive to determining that said appropriate time has been reached to switch from said second mode back to said first mode, switch said outdoor heat exchanger portion of said cooling system back to said first heat transfer fluid.

2. The system of claim 1, further comprising:
   a single loop passing through said data center to said outdoor heat exchanger portion;
   a first tank to store said first heat transfer fluid; and
   a second tank to store said second heat transfer fluid;

wherein said coolant switch arrangement comprises a valve arrangement configured to:
  isolate said first and second tanks during steady-state operation;
  allow said first heat transfer fluid to flow from said single loop into said first tank and said second heat transfer fluid to flow from said second tank into said single loop when transitioning from said first mode to said second mode; and
  allow said second heat transfer fluid to flow from said single loop into said second tank and said first heat transfer fluid to flow from said first tank back into said single loop when transitioning from said second mode to said first mode.

3. The system of claim 1, further comprising:
a first heat transfer fluid indoor loop passing through said data center;
a liquid-to-liquid heat exchanger selectively coupled to said first heat transfer fluid indoor loop;
a first heat transfer fluid indoor-outdoor loop selectively connectable to said first heat transfer fluid indoor loop and coupled to said outdoor heat exchanger portion; and
a second heat transfer fluid loop passing from said liquid-to-liquid heat exchanger to said outdoor heat exchanger portion;
wherein said coolant switch arrangement comprises a valve arrangement configured to:
  couple said first heat transfer fluid indoor loop to said first heat transfer fluid indoor-outdoor loop during steady-state operation in said first mode; and
  couple said first heat transfer fluid indoor loop to said liquid-to-liquid heat exchanger during steady-state operation in said second mode.

4. The system of claim 3, wherein said outdoor heat exchanger portion comprises a first outside heat exchanger coupled to said second heat transfer fluid loop and a second outside heat exchanger coupled to said first heat transfer fluid indoor-outdoor loop.

5. The system of claim 3, wherein said outdoor heat exchanger portion comprises a single outside heat exchanger having a first coil coupled to said second heat transfer fluid loop and a second coil coupled to said first heat transfer fluid indoor-outdoor loop.

* * * * *